(12) United States Patent
You et al.

(10) Patent No.: US 11,417,745 B2
(45) Date of Patent: Aug. 16, 2022

(54) STRUCTURE AND FORMATION METHOD OF SEMICONDUCTOR DEVICE WITH METAL GATE STACK

(71) Applicant: Taiwan Semiconductor Manufacturing Co., Ltd., Hsinchu (TW)

(72) Inventors: Jia-Chuan You, Taoyuan County (TW); Huan-Chieh Su, Changhua County (TW); Kuo-Cheng Chiang, Hsinchu County (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/943,672

(22) Filed: Jul. 30, 2020

(65) Prior Publication Data
US 2022/0037491 A1   Feb. 3, 2022

(51) Int. Cl.
| H01L 29/423 | (2006.01) |
|---|---|
| H01L 21/8234 | (2006.01) |
| H01L 27/088 | (2006.01) |
| H01L 29/66 | (2006.01) |
| H01L 29/78 | (2006.01) |

(52) U.S. Cl.
CPC ............... *H01L 29/42376* (2013.01); *H01L 21/823431* (2013.01); *H01L 27/0886* (2013.01); *H01L 29/6653* (2013.01); *H01L 29/66545* (2013.01); *H01L 29/7856* (2013.01)

(58) Field of Classification Search
CPC .......... H01L 29/42376; H01L 29/6653; H01L 29/66545; H01L 29/7856; H01L 21/823431
See application file for complete search history.

(56) References Cited

U.S. PATENT DOCUMENTS

| 9,209,247 B2 | 12/2015 | Colinge et al. |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Christine A Enad
(74) *Attorney, Agent, or Firm* — Birch, Stewart, Kolasch & Birch, LLP

(57) ABSTRACT

A semiconductor device structure and the fabrication method are provided. The semiconductor device structure includes a first channel structure and a second channel structure over a substrate. The second channel structure is longer than the first channel structure. The semiconductor device structure also includes a first gate stack over the first channel structure, and the first gate stack has a first width. The semiconductor device structure further includes a first gate spacer extending along a sidewall of the first gate stack. In addition, the semiconductor device structure includes a second gate stack over the second channel structure and a second gate spacer extending along a sidewall of the second gate stack. The second gate stack has a portion extending along the second gate spacer, and the portion of the second gate stack has a second width. Half of the first width is greater than the second width.

20 Claims, 26 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 2020/0006341 A1* | 1/2020 | Hong .............. H01L 21/823828 |
| 2020/0066839 A1* | 2/2020 | Zhang .............. H01L 29/78618 |
| 2021/0328010 A1* | 10/2021 | Kim ..................... H01L 27/092 |

* cited by examiner

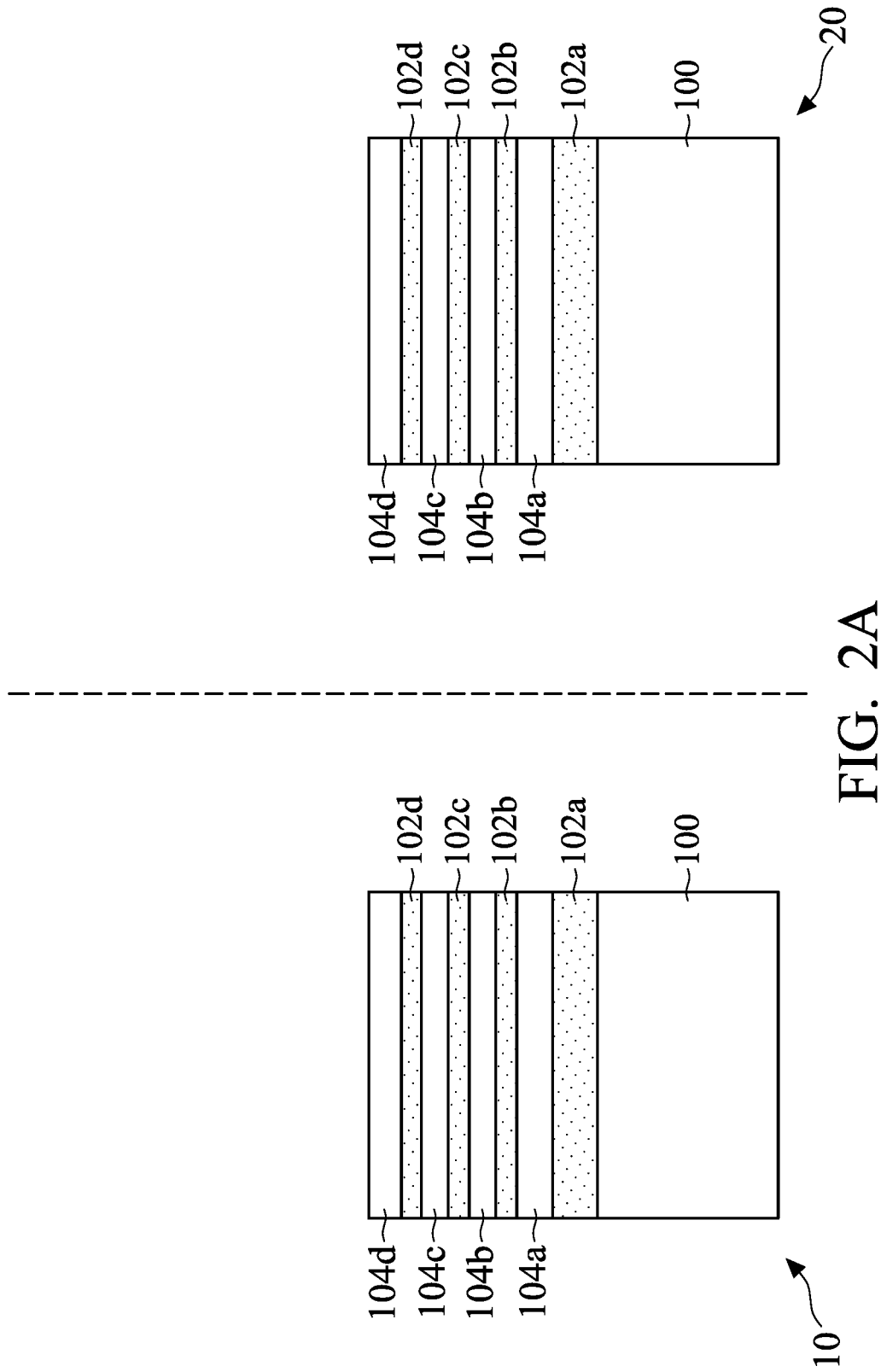

STRUCTURE AND FORMATION METHOD OF SEMICONDUCTOR DEVICE WITH METAL GATE STACK

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2D are cross-sectional views of various stages of a process for forming a semiconductor device structure, in accordance with some embodiments.

DETAILED DESCRIPTION

Figure 1A:
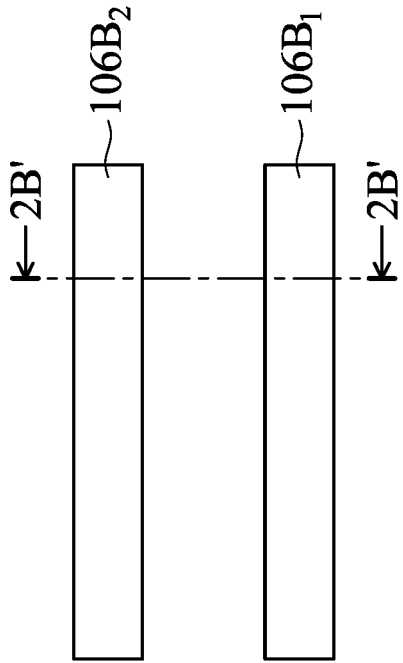
FIGS. 1A-1B are top views of various stages of a process for forming a semiconductor device structure, in accordance with some embodiments.
Figure 1A:
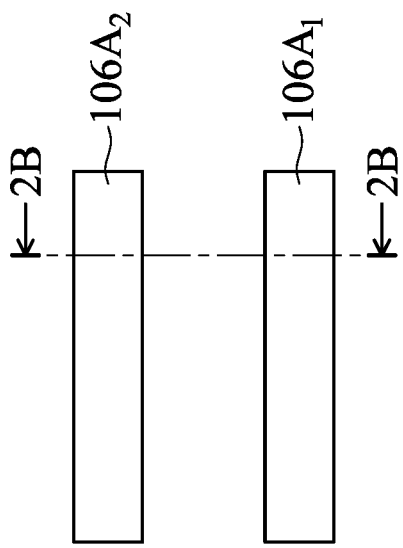

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2B:
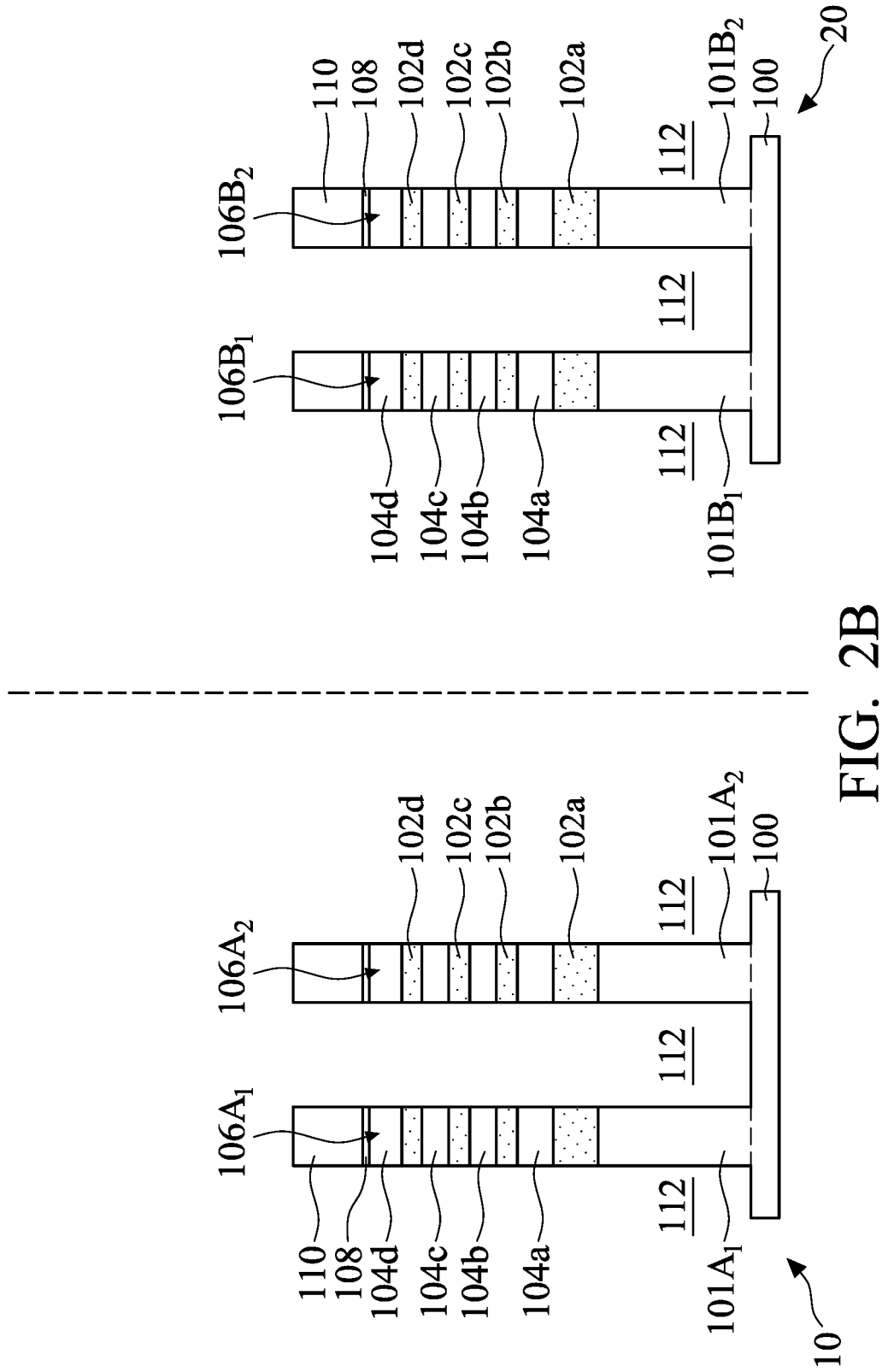

FIGS. 2A-2D are cross-sectional views of various stages of a process for forming a semiconductor device structure, in accordance with some embodiments. As shown in FIG. 2A, a semiconductor substrate 100 is received or provided. The semiconductor substrate 100 has a first region 10 and a second region 20. In some embodiments, one or more short channel (SC) devices are to be formed over the first region 10. One or more long channel (LC) devices are to be formed over the second region 20. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. The semiconductor stack covers the first region 10 and the second region 20 of the semiconductor substrate 10. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A. In some embodiments, the semiconductor layer 102a is thicker than the semiconductor layer 102b, 102c, or 102d. In some embodiments, the semiconductor layer 104a is thicker than the semiconductor layer 104b, 104c, or 104d.

In the present disclosure, the side of the semiconductor substrate 100 where the semiconductor stack is located is referred to as the frontside. The side opposite to the frontside with respect to the semiconductor substrate 100 is referred to as the backside.

In some embodiments, the semiconductor layers 102b-102d function as first sacrificial layers that will be removed in a subsequent process to release the semiconductor layers 104b-104d. The semiconductor layers 104b-104d that are released may function as channel structures of one or more transistors. In some embodiments, the semiconductor layer 102a is used as a second sacrificial layer and will be replaced with a dielectric material in a subsequent process.

In some embodiments, the semiconductor layer 104a functions as a base layer. The base layer may be formed into base structures and be used to physically separate a subsequently formed metal gate and a subsequently formed backside conductive contact from each other by a greater distance. Therefore, short circuiting between the subsequently formed metal gate and the subsequently formed backside conductive contact is prevented.

In some embodiments, the semiconductor layers 104a-104d that will be used to form channel structures are made of a material that is different than that of the semiconductor layers 102a-102d. In some embodiments, the semiconductor layers 104a-104d are made of or include silicon. In some embodiments, the first sacrificial layers (102b-102c) and the second sacrificial layer (102a) include silicon germanium with different atomic concentrations of germanium to achieve different etching selectivity and/or different oxidation rates during subsequent processing.

In some embodiments, the semiconductor layer 102a has a different atomic concentration of germanium than that of the semiconductor layer 102b, 102c, or 102d. In some embodiments, the semiconductor layer 102a has a greater atomic concentration of germanium than that of the semiconductor layer 102b, 102c, or 102d. The atomic concentration of germanium of the semiconductor layer 102a may be in a range from about 46% to about 65%. The atomic concentration of germanium of the semiconductor layer 102b, 102c, or 102d may be in a range from about 21% to about 45%.

The present disclosure contemplates that the semiconductor layers 102b-102d, the semiconductor layers 104a-104d, and the semiconductor layer 102a include any combination of materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. One or more photolithography processes and one or more etching processes are used to pattern the semiconductor stack into fin structures $106A_1$, $106A_2$, $106B_1$, and $106B_2$, as shown in FIG. 2B in accordance with some embodiments. The fin structures $106A_1$ and $106A_2$ are formed over the first region 10, and the fin structures $106B_1$ and $106B_2$ are formed over the second region 20.

The fin structures $106A_1$, $106A_2$, $106B_1$, and $106B_2$ may be patterned by any suitable method. For example, the fin structures $106A_1$, $106A_2$, $106B_1$, and $106B_2$ may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures $106A_1$, $106A_2$, $106B_1$, and $106B_2$ may include portions of the semiconductor layers $102a$-$102d$ and $104a$-$104d$ and semiconductor fin $101A_1$, $101A_2$, $101B_1$ or $101B_2$. The semiconductor substrate 100 may also be partially removed during the etching process that forms the fin structures $106A_1$, $106A_2$, $106B_1$, and $106B_2$. Protruding portions of the semiconductor substrate 100 that remain form the semiconductor fins $101A_1$, $101A_2$, $101B_1$ and $101B_2$, as shown in FIG. 2B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer $104d$. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers $102a$-$102d$ and $104a$-$104d$. The second layer 110 may be made of silicon nitride, silicon oxynitride, silicon carbide, one or more other suitable materials, or a combination thereof.

Figure 1B:
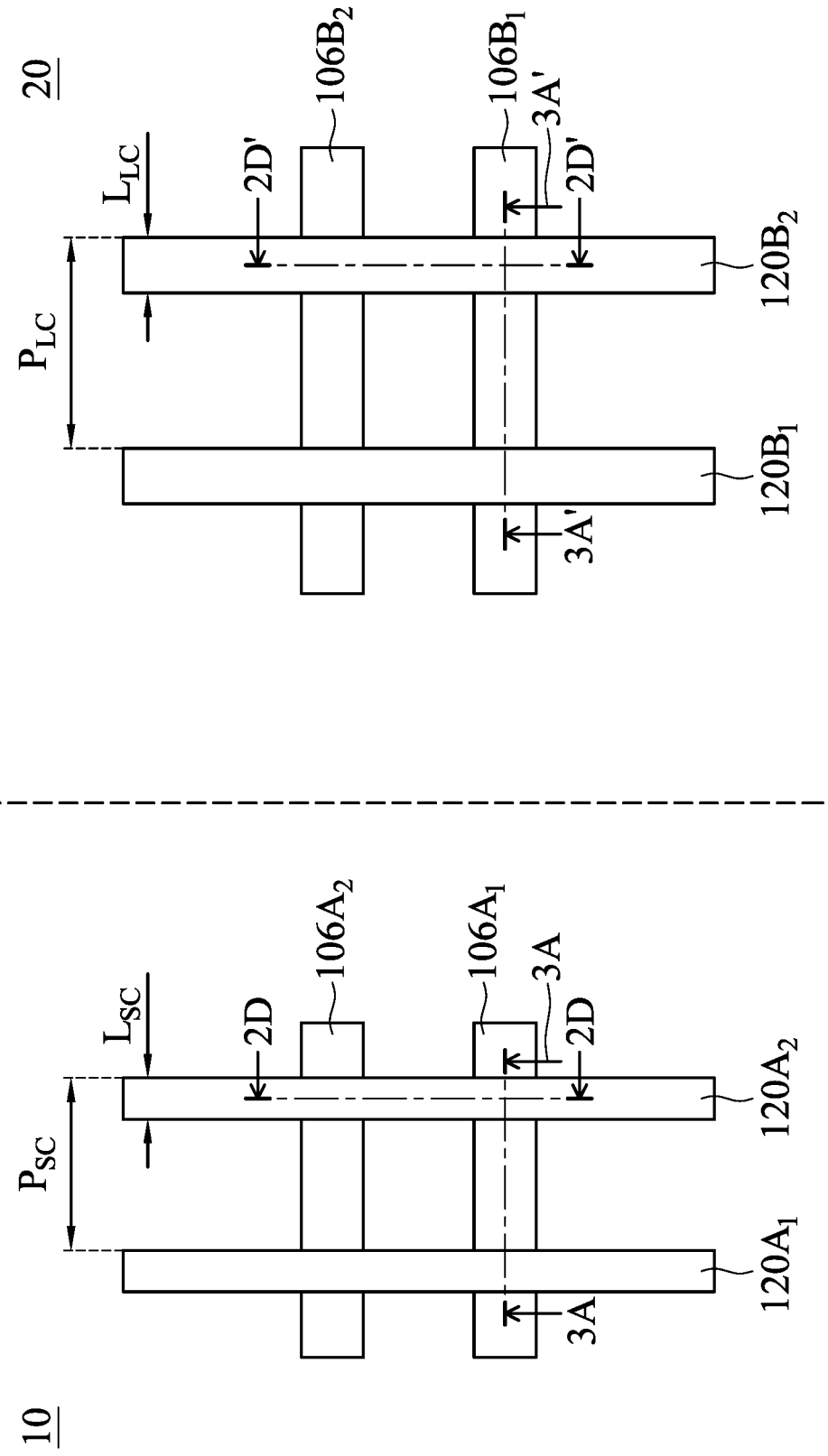

FIGS. 1A-1B are top views of various stages of a process for forming a semiconductor device structure, in accordance with some embodiments. In some embodiments, the fin structures $106A_1$, $106A_2$, $106B_1$ and $106B_2$ are oriented lengthwise. In some embodiments, the extending directions of the fin structures $106A_1$, $106A_2$, $106B_1$ and $106B_2$ are substantially parallel to each other, as shown in FIG. 1A. In some embodiments, FIG. 2B is a cross-sectional view of the structure taken along the lines 2B-2B and 2B'-2B' in FIG. 1A.

Figure 2C:
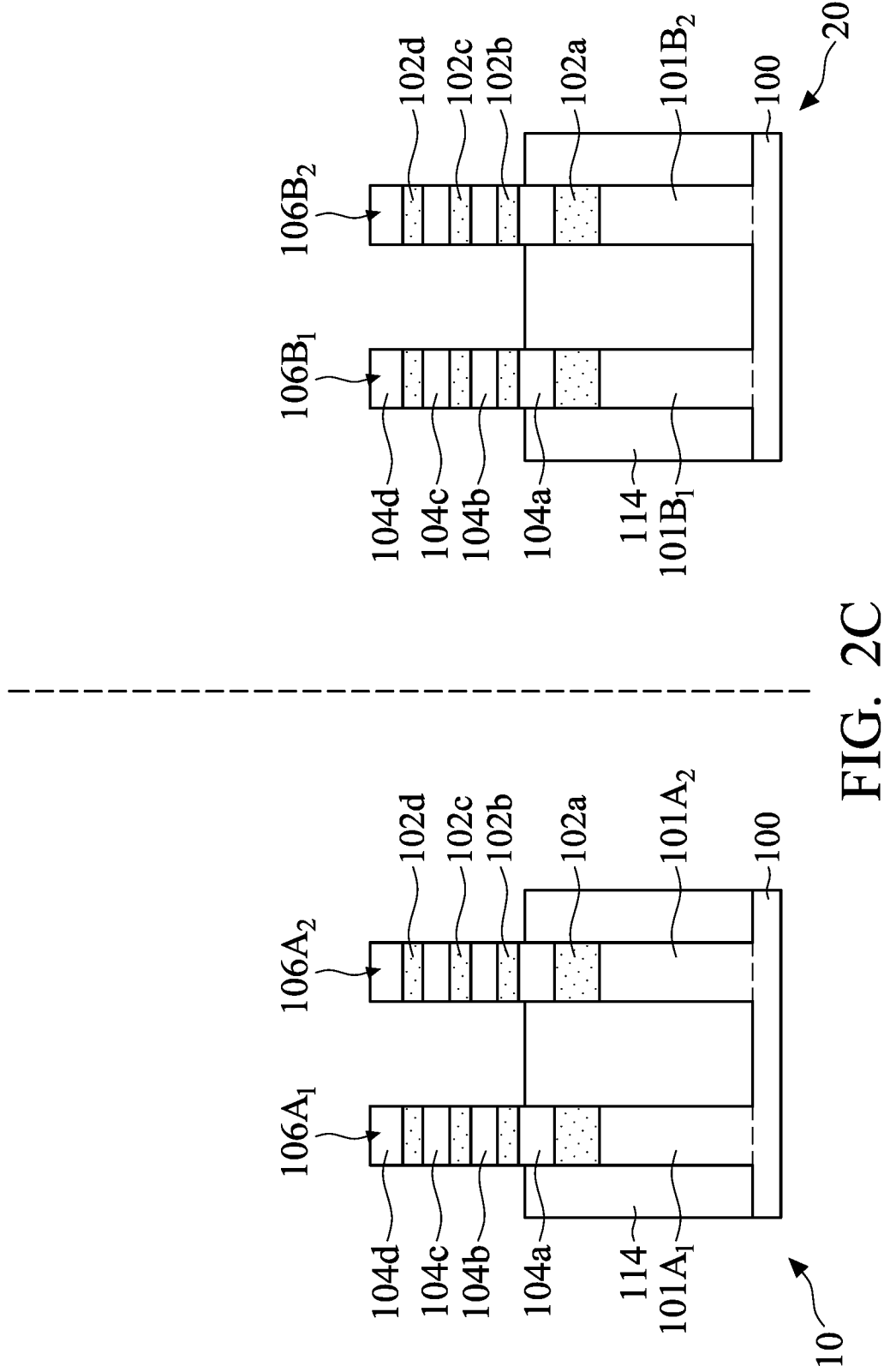

As shown in FIG. 2C, an isolation structure 114 is formed to surround lower portions of the fin structures $106A_1$, $106A_2$, $106B_1$ and $106B_2$, in accordance with some embodiments. In some embodiments, one or more dielectric layers are deposited over the fin structures $106A_1$, $106A_2$, $106B_1$ and $106B_2$ and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures $106A_1$, $106A_2$, $106B_1$ and $106B_2$ protrude from the top surface of the isolation structure 114, as shown in FIG. 2C.

In some embodiments, the etching back process for forming the isolation structure 114 is carefully controlled to ensure that the topmost surface of the isolation structure 114 is positioned at a suitable height level, as shown in FIG. 2C. In some embodiments, the topmost surface of the isolation structure 114 is below the topmost surface of the semiconductor layer $104a$ (that functions as a base layer) and above the bottommost surface of the semiconductor layer $104a$.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 114.

Figure 2D:
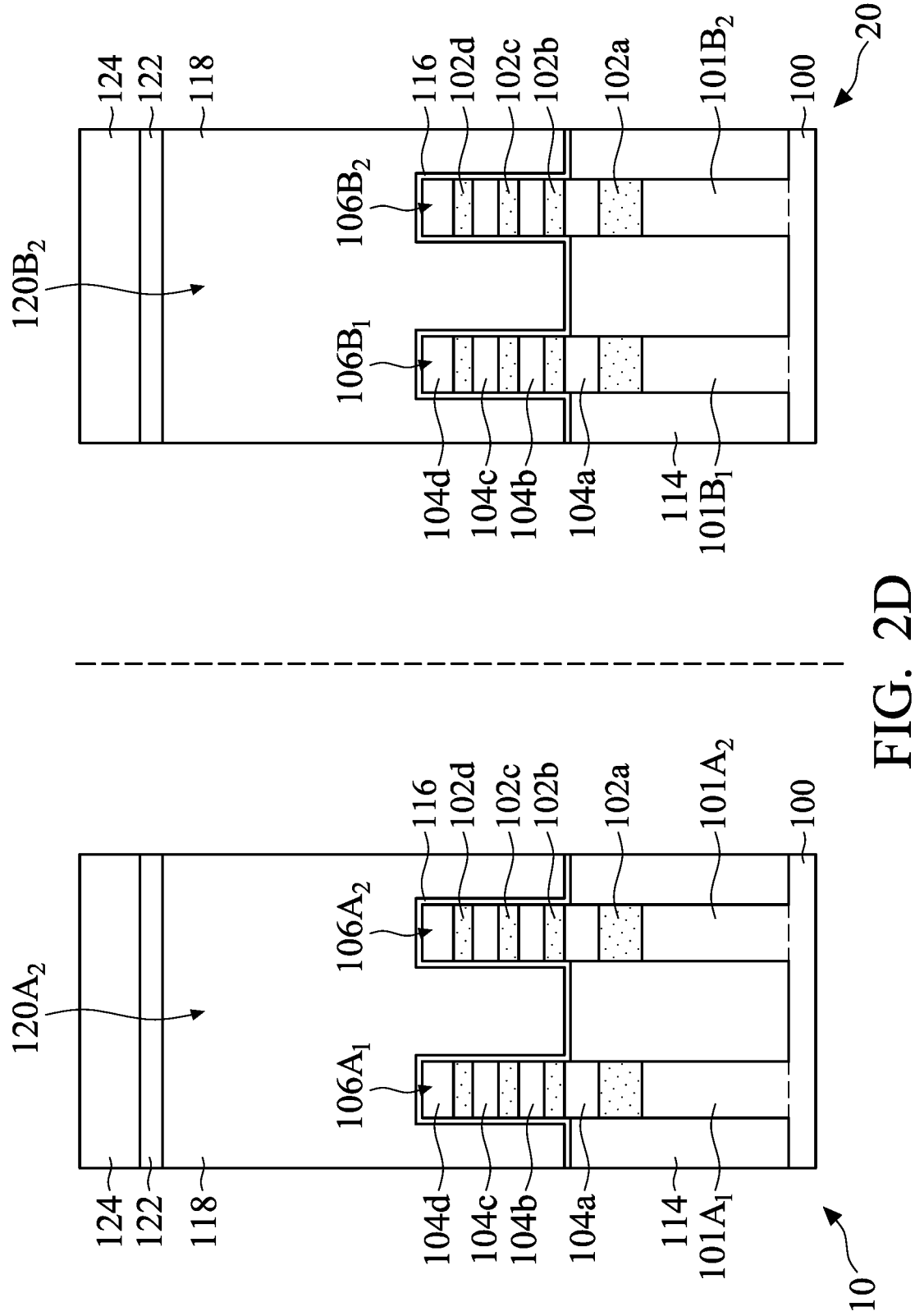
Figure 3A:
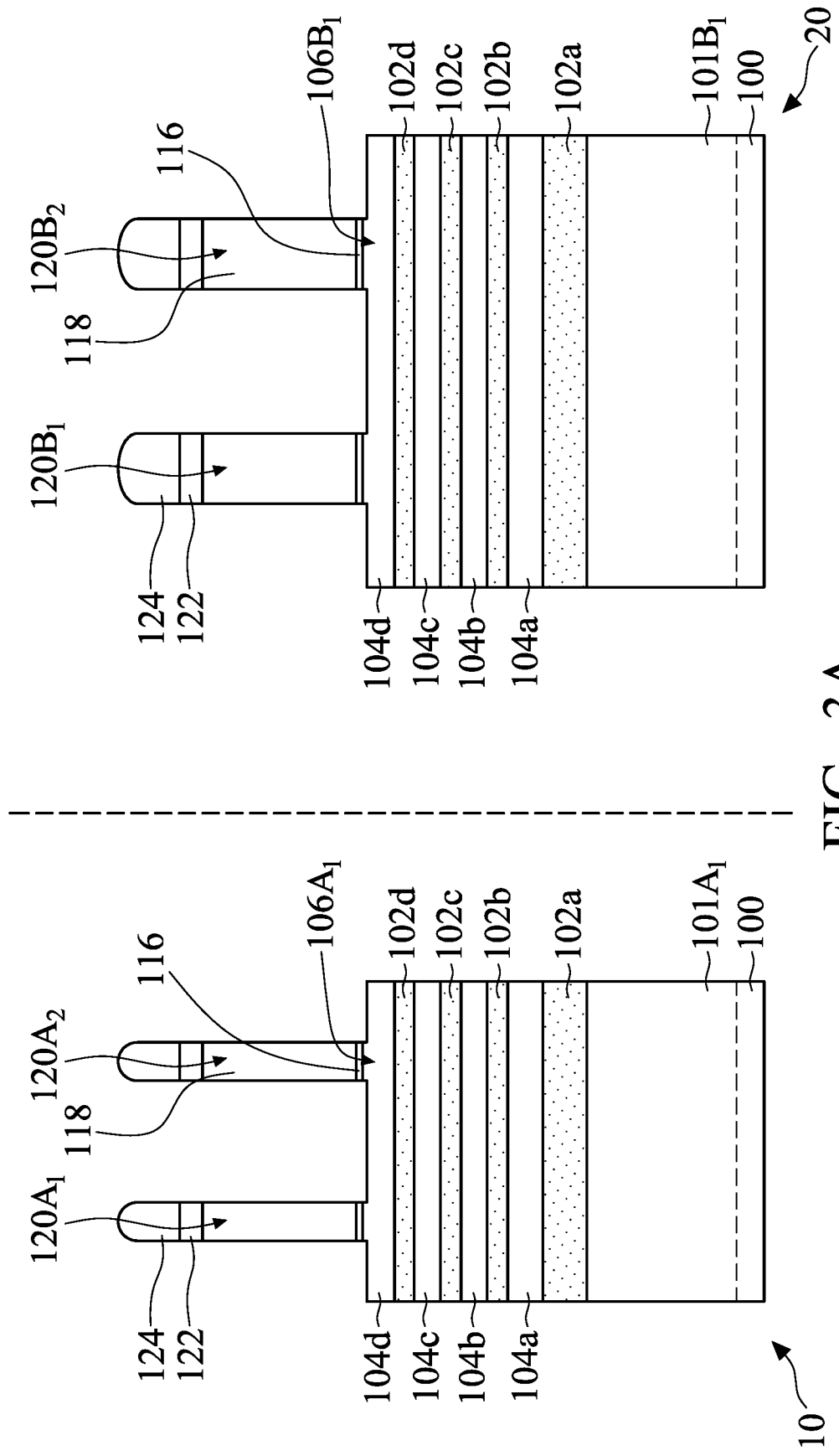
FIGS. 3A-3Q are cross-sectional views of various stages of a process for forming a semiconductor device structure, in accordance with some embodiments.

Afterwards, dummy gate stacks $120A_1$, $120A_2$, $120B_1$, and $120B_2$ are formed to extend across the fin structures fin structures $106A_1$, $106A_2$, $106B_1$ and $106B_2$, as shown in FIG. 1B in accordance with some embodiments. In some embodiments, FIG. 2D is a cross-sectional view of the structure taken along the lines 2D-2D and 2D'-2D' in FIG. 1B. FIGS. 3A-3K are cross-sectional views of various stages of a process for forming a semiconductor device structure, in accordance with some embodiments. In some embodiments, FIG. 3A is a cross-sectional view of the structure taken along the lines 3A-3A and 3A'-3A' in FIG. 1B.

As shown in FIGS. 1B, 2D, and 3A, the dummy gate stacks $120A_1$, $120A_2$, $120B_1$, and $120B_2$ are formed to partially cover and to extend across the fin structures $106A_1$, $106A_2$, $106B_1$ and $106B_2$, in accordance with some embodiments. In some embodiments, the dummy gate stacks $120A_1$ and $120A_2$ wraps around the fin structures $106A_1$ and $106A_2$. The dummy gate stacks $120B_1$ and $120B_2$ wraps around the fin structures $106B_1$ and $106B_2$. As shown in FIG. 2D, the dummy gate stack $120A_2$ extends across and wraps around the fin structures $106A_1$ and $106A_2$, and the dummy gate stack $120B_2$ extends across and wraps around the fin structures $106B_1$ and $106B_2$.

In some embodiments, the device formed over the second region 20 has a longer channel width than the device formed over the first region 10. As shown in FIG. 1B, the device formed over the first region 10 has a channel width $L_{SC}$, and the device formed over the second region 20 has a channel width $L_{LC}$. The channel width $L_{LC}$ is longer than the channel width $L_{SC}$. The channel width $L_{sc}$ may be in a range from about 10 nm to about 30 nm. The channel width $L_{LC}$ may be in a range from about 35 nm to about 300 nm. As shown in FIG. 1B, the pitch $P_{LC}$ between the dummy gate stacks $120B_1$ and $120B_2$ is longer than the pitch $P_{SC}$ between the dummy gate stacks $120A_1$ and $120A_2$.

As shown in FIGS. 2D and 3A, each of the dummy gate stacks $120A_1$, $120A_2$, $120B_1$, and $120B_2$ includes a dummy gate dielectric layer 116 and a dummy gate electrode 118. The dummy gate dielectric layers 116 may be made of or include silicon oxide. The dummy gate electrodes 118 may be made of or include polysilicon. In some embodiments, a dummy gate dielectric material layer and a dummy gate electrode layer are sequentially deposited over the isolation feature 114 and the fin structures $106A_1$, $106A_2$, $106B_1$ and $106B_2$.

The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks $120A_1$, $120A_2$, $120B_1$, and $120B_2$.

In some embodiments, hard mask elements including mask layers 122 and 124 are used to assist in the patterning process for forming the dummy gate stacks $120A_1$, $120A_2$, $120B_1$, and $120B_2$. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks $120A_1$, $120A_2$, $120B_1$, and $120B_2$ that include the dummy gate dielectric layer 116 and the dummy gate electrodes 118.

Figure 3B:
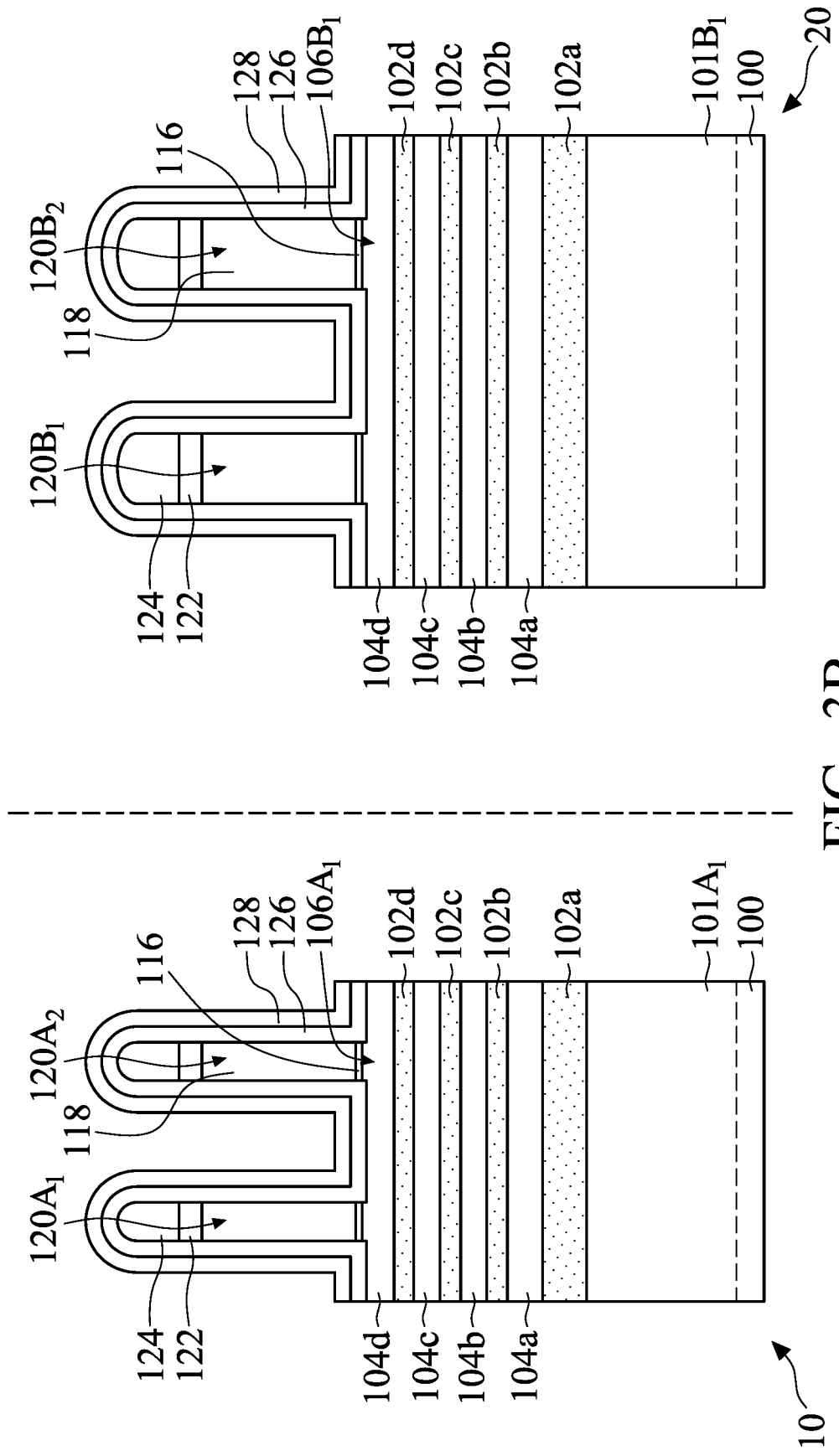

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks $120A_1$, $120A_2$, $120B_1$, and $120B_2$. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
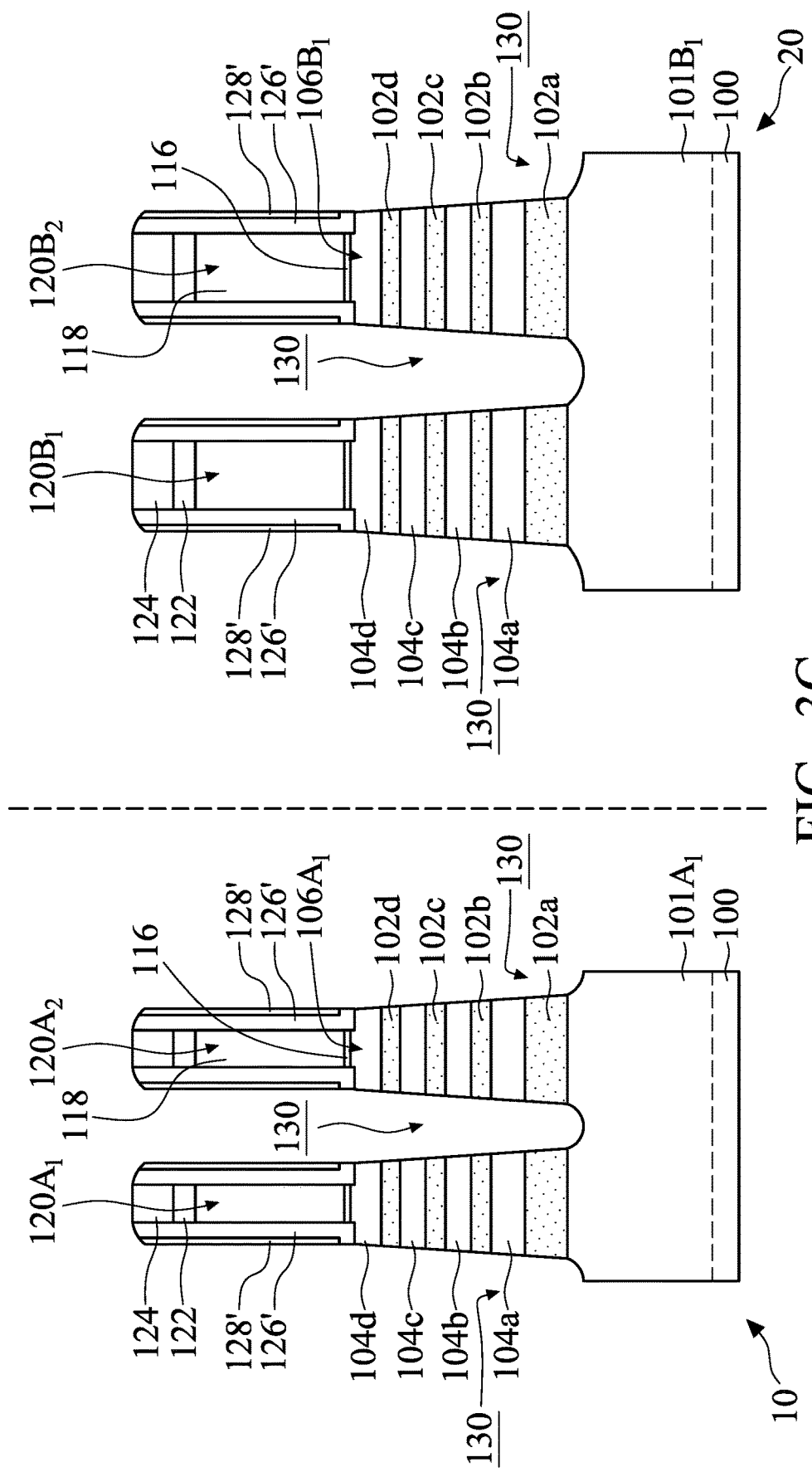

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form gate spacers 126' and 128', respectively. The gate spacers 126' and 128' extend along the sidewalls of the dummy gate stacks $120A_1$, $120A_2$, $120B_1$, and $120B_2$, as shown in FIG. 3C.

In some embodiments, the fin structures $106A_1$, $106A_2$, $106B_1$ and $106B_2$ are partially removed to form recesses 130 that are used to contain epitaxial structures (such as source/drain structures) that will be formed later. The recesses 130 expose the side surfaces of the semiconductor layers 102a-102d and 104a-104d. As shown in FIG. 3C, the fin structures $106A_1$ and $106B_1$ are partially removed to form some of the recesses 130, in accordance with some embodiments. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure $106A_1$ or $106B_1$. In some embodiments, the recesses 130 further extend into the semiconductor fin $101A_1$ or $101B_1$, as shown in FIG. 3C. In some embodiments, the gate spacers 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
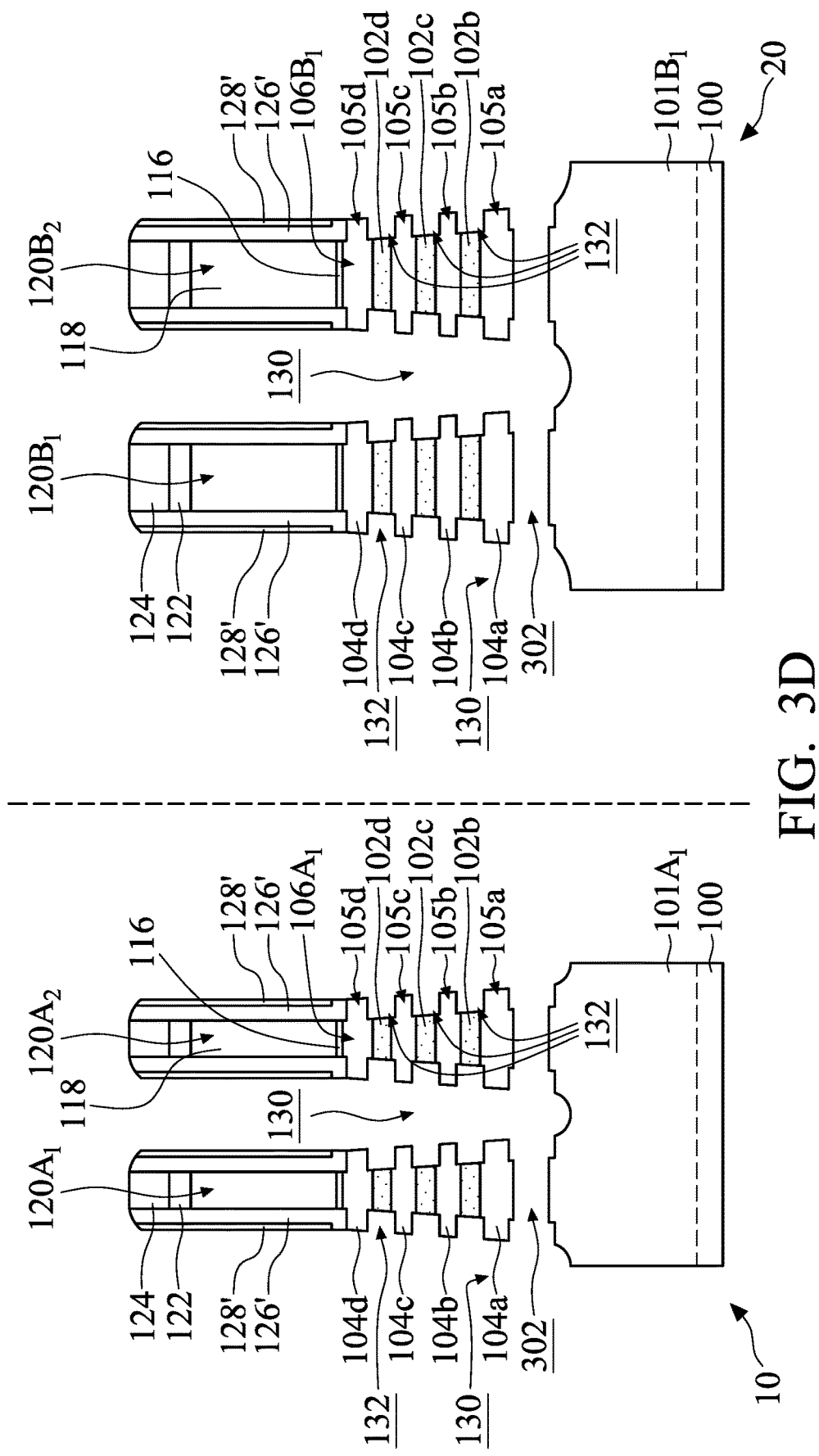

As shown in FIG. 3D, the semiconductor layers 102b-102d are laterally etched, in accordance with some embodiments. As a result, edges of the semiconductor layers 102b-102d retreat from edges of the semiconductor layers 104a-104d. As shown in FIG. 3D, recesses 132 are formed due to the lateral etching of the semiconductor layers 102b-102d. The recesses 132 may be used to contain inner spacers that will be formed later. The semiconductor layers 102b-102d may be laterally etched using a wet etching process, a dry etching process, or a combination thereof. In some other embodiments, the semiconductor layers 102b-102d are partially oxidized before being laterally etched.

In some embodiments, the semiconductor layer 102a is also etched during the formation of the recesses 132. As mentioned above, in some embodiments, the semiconductor layer 102a has a greater atomic concentration of germanium than that of the semiconductor layer 102b, 102c, or 102d. In some embodiments, the semiconductor layer 102a is thicker than the semiconductor layer 102b, 102c, or 102d. As a result, the semiconductor layer 102a is etched or oxidized at a greater rate than the semiconductor layers 102b-102d.

In some embodiments, the semiconductor layers 102a is completely removed during the formation the recesses 132. As a result, through holes 302 are formed between the semiconductor fin $101A_1$ and the semiconductor layer 104a and between the semiconductor fin $101B_1$ and the semiconductor layer 104a, as shown in FIG. 3D in accordance with some embodiments. Due to the support of the dummy gate stacks $120A_1$, $120A_2$, $120B_1$, and $120B_2$ (as shown in FIG. 2E), the fin structure $106A_1$, $106A_2$, $106B_1$ and $106B_2$ are prevented from falling down even if the semiconductor layer 102a is removed. The through holes 302 may be used to contain insulating structures that will be formed later.

During the lateral etching of the semiconductor layers 102b-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the respective inner portion of the semiconductor layers 104a-104d.

Figure 3E:
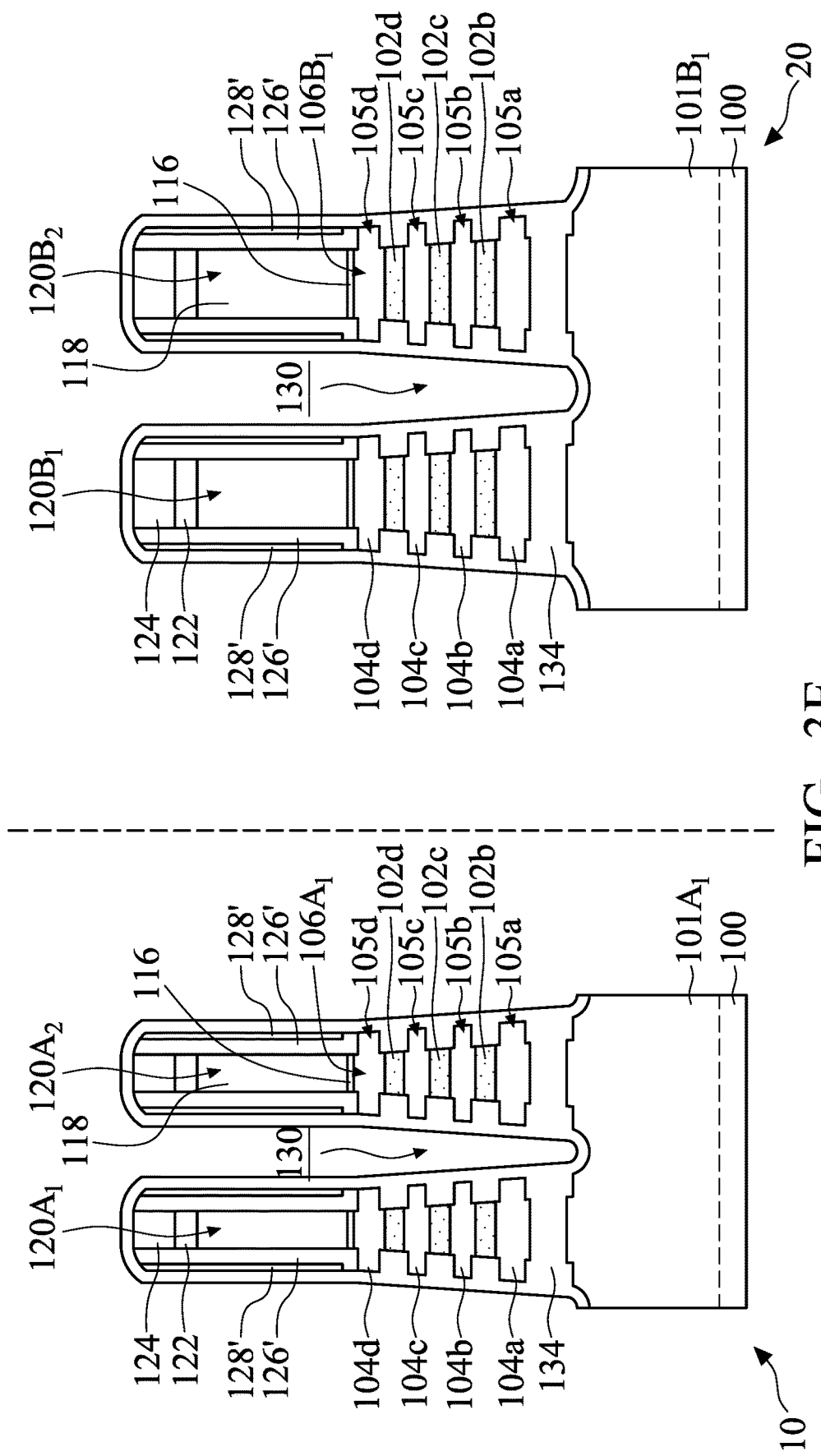

As shown in FIG. 3E, an insulating layer 134 is deposited over the structure shown in FIG. 3D, in accordance with some embodiments. The insulating layer 134 covers the dummy gate stacks 120A$_1$, 120A$_2$, 120B$_1$, and 120B$_2$ and fills the recesses 132 and the through holes 302. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

Figure 3F:
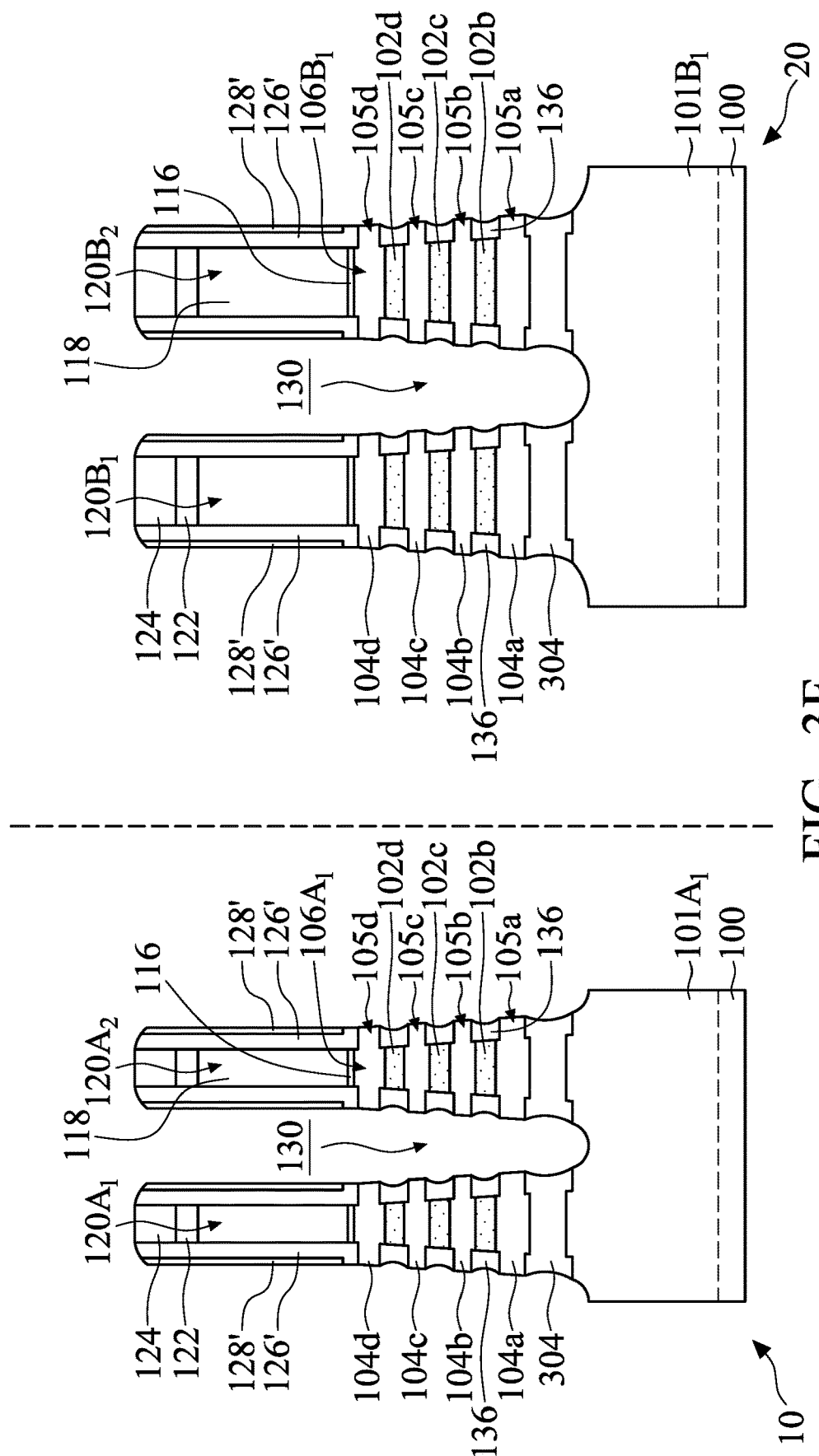

As shown in FIG. 3F, an etching process is used to partially remove the insulating layer 134, in accordance with some embodiments. The remaining portions of the insulating layer 134 form inner spacers 136 and insulating structures 304, as shown in FIG. 3F. The etching process may include a dry etching process, a wet etching process, or a combination thereof.

Since the inner spacers 136 and the insulating structures 304 are portions of the insulating layer 134, the inner spacers 136 and the insulating structures 304 are made of the same material, in accordance with some embodiments. However, embodiments of the disclosure are not limited thereto. In some other embodiments, the inner spacers 136 and the insulating structures 304 are formed separately from different insulating layers. In these cases, the inner spacers 136 and the insulating structures 304 may be made of different materials.

The insulating structures 304 may be made of or include a low-k material (such as silicon oxide, SiN, SiCN, SiOC, and/or SiOCN), a high-k material (such as hafnium oxide, zirconium oxide, zirconium aluminum oxide, hafnium aluminum oxide, hafnium silicon oxide, and/or aluminum oxide), one or more other suitable materials (such as TiO, TaO, LaO, YO, TaCN, and/or ZrN), or a combination thereof.

The inner spacers 136 cover the edges of the semiconductor layers 102b-102d that are originally exposed by the recesses 132. The inner spacers 136 may be used to prevent subsequently formed epitaxial structures (that function as, for example, source/drain structures) from being damaged during a subsequent process for removing the sacrificial layers 102b-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fins 101A$_1$ and 101B$_1$ originally covered by the insulating layer 134 are exposed by the recesses 130, as shown in FIG. 3F. The edges of the semiconductor layers 104a-104d are also exposed by the recesses 130, as shown in FIG. 3F.

Figure 3G:
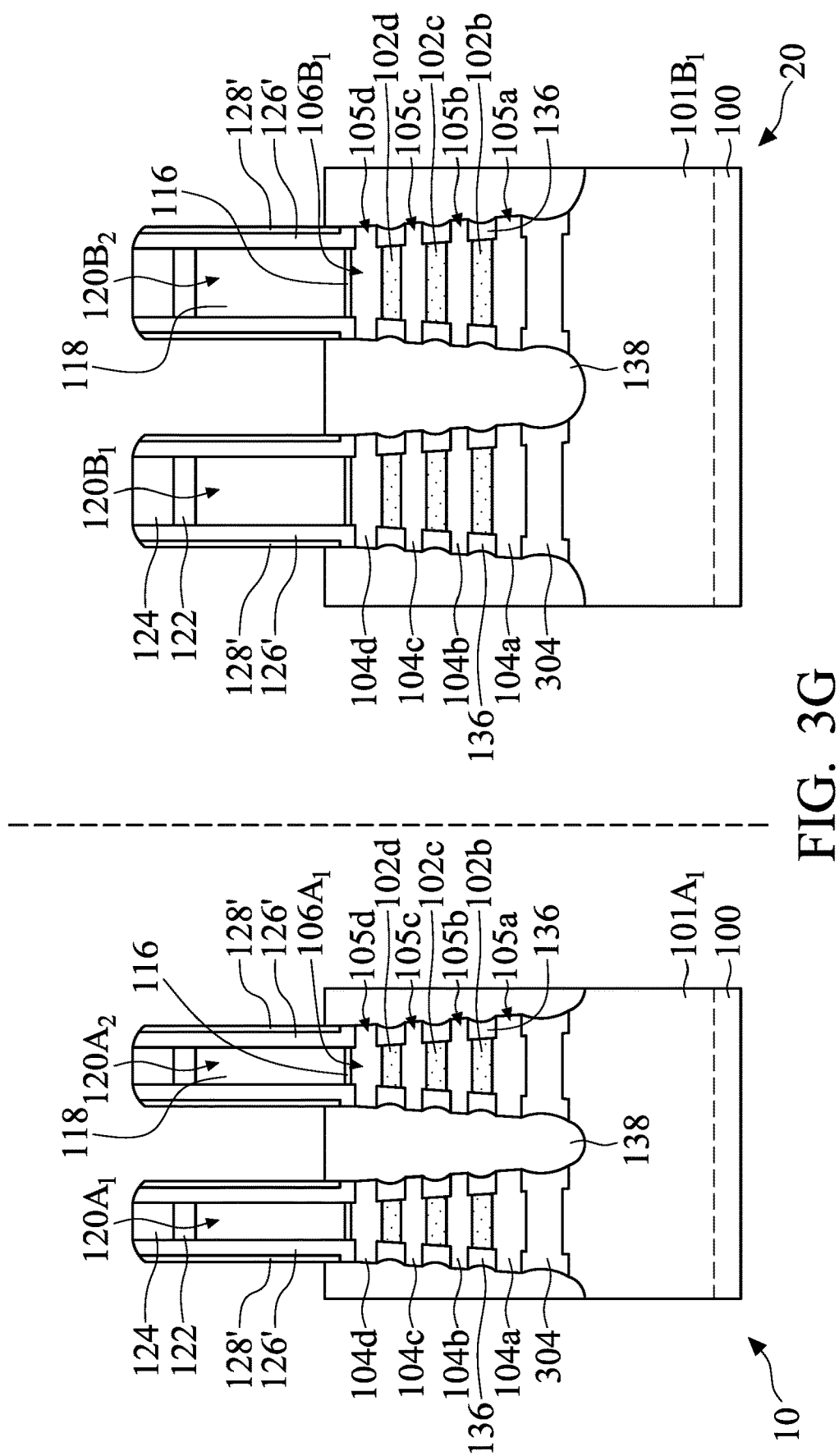

As shown in FIG. 3G, epitaxial structures 138 are formed beside the dummy gate stacks 120A$_1$, 120A$_2$, 120B$_1$, and 120B$_2$, in accordance with some embodiments. In some embodiments, the epitaxial structures 138 fill the recesses 130, as shown in FIG. 3G. In some embodiments, the epitaxial structures 138 overfill the recesses 130. In these cases, the top surfaces of the epitaxial structures 138 are higher than the top surface of the dummy gate dielectric layer 116. In some other embodiments, the epitaxial structures 138 partially fill the recesses 130.

In some embodiments, the epitaxial structures 138 connect to the semiconductor layers 104b-104d. Each of the semiconductor layers 104b-104d is sandwiched between the epitaxial structures 138. In some embodiments, the epitaxial structures 138 function as source/drain structures. In some embodiments, the epitaxial structures 138 are p-type doped regions. The epitaxial structures 138 may include epitaxially grown silicon germanium (SiGe), epitaxially grown silicon, or another suitable epitaxially grown semiconductor material.

However, embodiments of the disclosure are not limited thereto. In some other embodiments, the epitaxial structures 138 are n-type doped regions. The epitaxial structures 138 may include epitaxially grown silicon, epitaxially grown silicon carbide (SiC), epitaxially grown germanium, or another suitable epitaxially grown semiconductor material.

In some embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable p-type dopants. For example, the epitaxial structures 138 are SiGe source/drain features or Si source/drain features that are doped with boron (B), gallium (Ga), indium (In), or another suitable dopant. In some other embodiments, the epitaxial structures 138 are doped with one or more suitable n-type dopants. For example, the epitaxial structures 138 are Si source/drain features doped with phosphor (P), antimony (Sb), or another suitable dopant.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

Figure 3H:
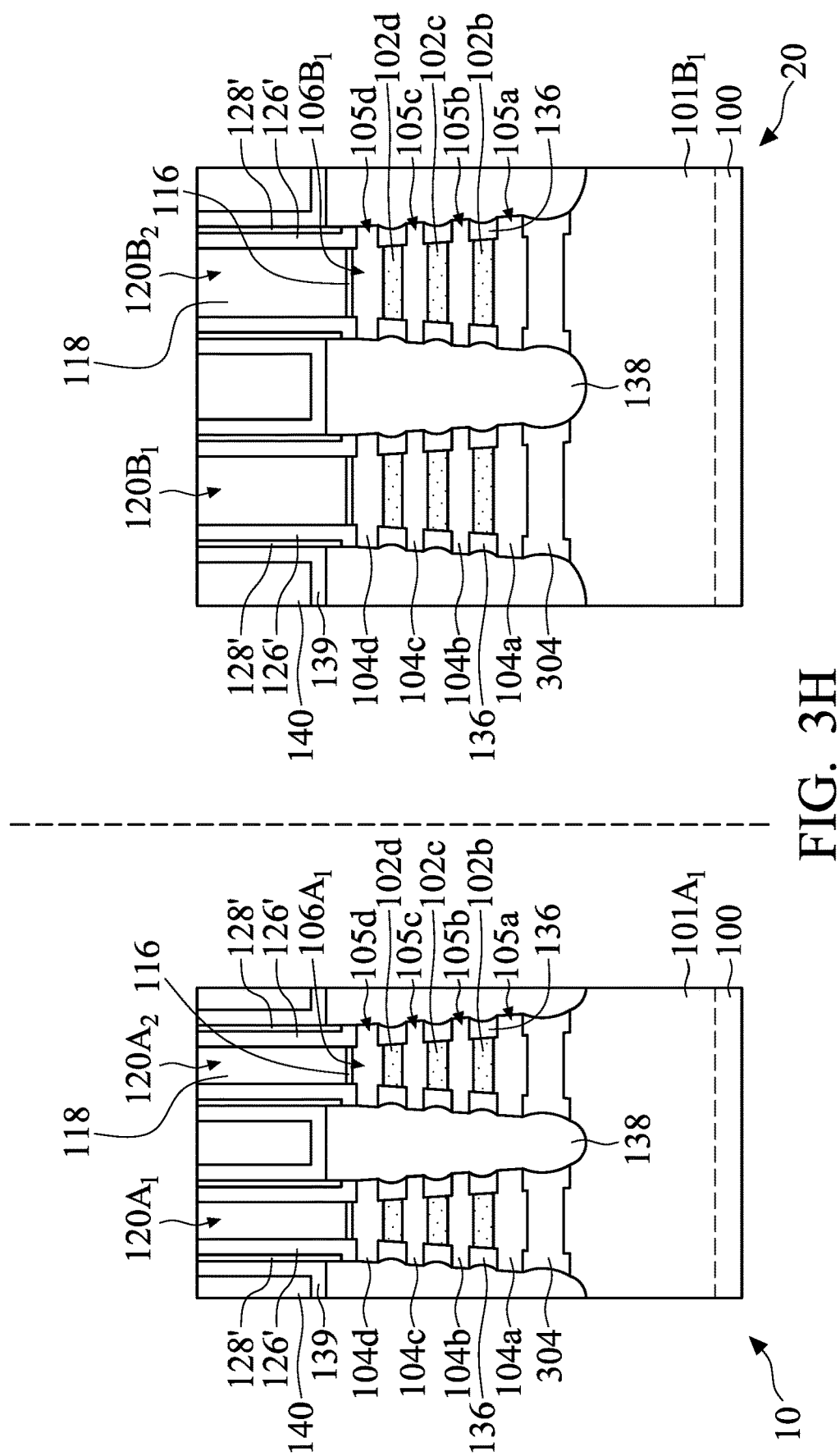

As shown in FIG. 3H, a contact etch stop layer 139 and a dielectric layer 140 are formed to cover the epitaxial structures 138 and to surround the dummy gate stacks 120A$_1$, 120A$_2$, 120B$_1$, and 120B$_2$, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 used for defining the dummy gate stacks $120A_1$, $120A_2$, $120B_1$, and $120B_2$ are also removed during the planarization process. In some embodiments, after the planarization process, the top surfaces of the contact etch stop layer 139, the dielectric layer 140, and the dummy gate electrodes 118 are substantially level with each other.

Figure 3I:
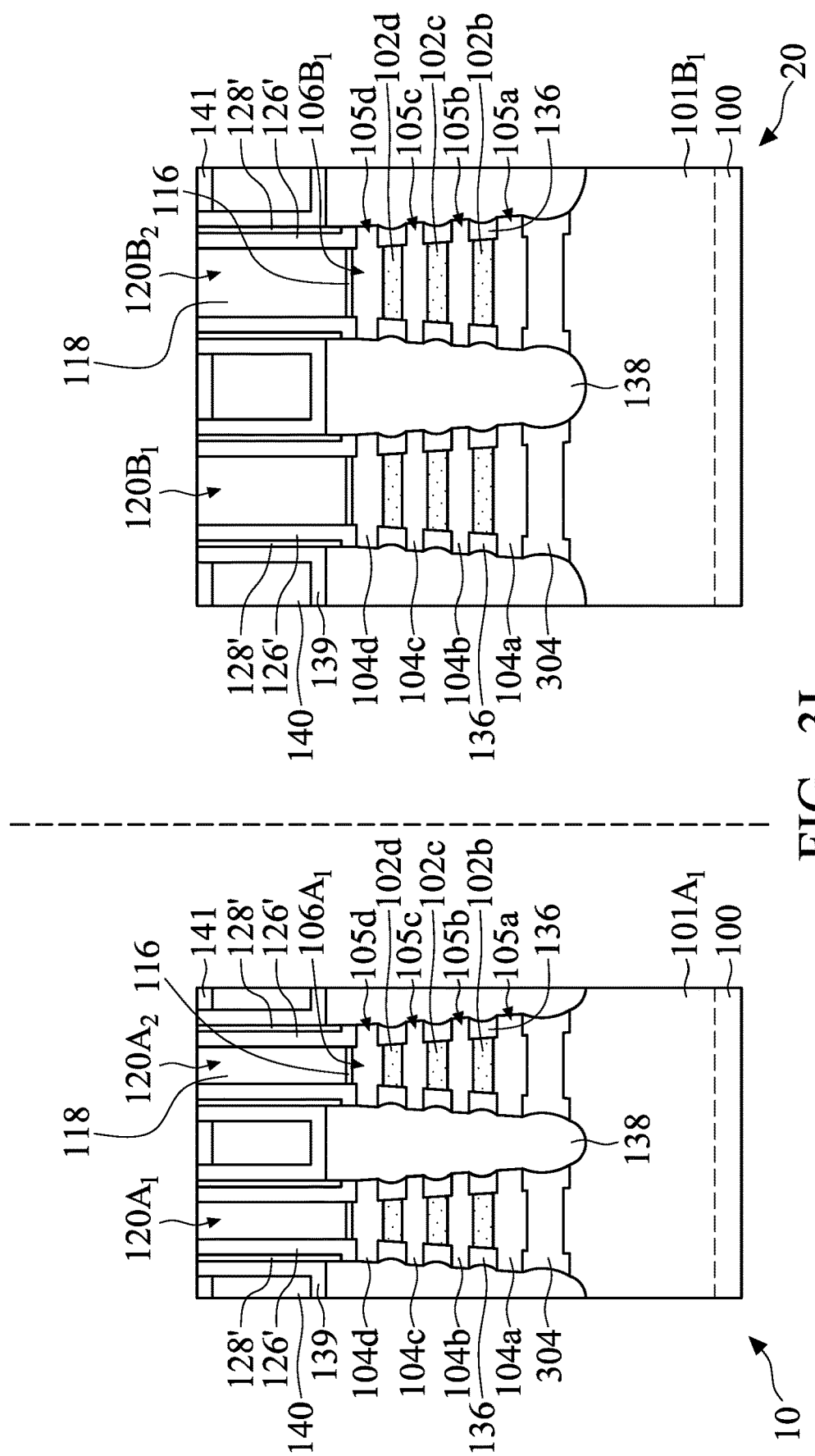

As shown in FIG. 3I, protective caps 141 are formed over the dielectric layer 140, in accordance with some embodiments. The protective caps 141 may be used to protect the dielectric layer 140 thereunder. The dielectric layer 140 may be protected during the subsequent processes such as a subsequent metal gate etching back process. The dielectric layer 140 may thus be kept with a suitable thickness. The protective caps 141 may be made of or include SiN, SiCN, SiOC, SiOCN, SiC, SiON, AlO, AlN, AlON, ZrO, ZrN, ZrAlO, HfO, one or more other suitable materials, or a combination thereof.

In some embodiments, the dielectric layer 140 is partially removed using one or more etching processes. As a result, recesses are formed over the remaining dielectric layer 140. Afterwards, a protective layer is formed to overfill the recesses. The protective layer may be formed using a CVD process, an ALD process, one or more other applicable processes, or a combination thereof. A planarization process is then used to remove the portion of the protective layer outside of the recesses. As a result, the remaining portions of the protective layer within the recesses form the protective caps 141. The planarization process may include a CMP process, an etching process, a grinding process, a dry polishing process, one or more other applicable processes, or a combination thereof.

Figure 3J:
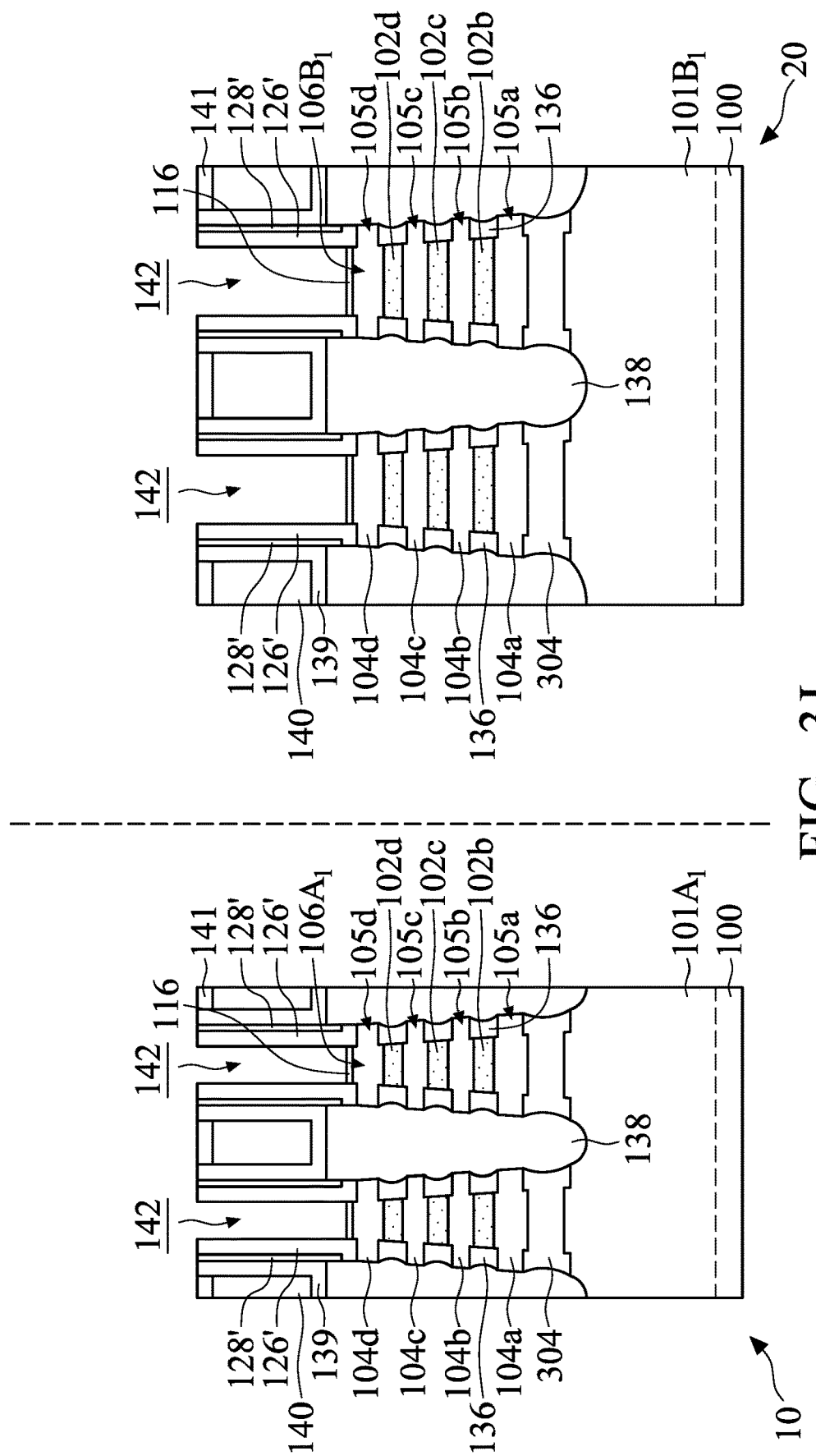

As shown in FIG. 3J, one or more etching processes are used to remove the dummy gate electrodes 118 to form trenches 142, in accordance with some embodiments. The trenches 142 are surrounded by the dielectric layer 140. The trenches 142 expose the dummy gate dielectric layer 116. Each of the trenches 142 formed over the second region 20 is wider than each of the trenches 142 formed over the first region 10. During the formation of the trenches 142, the dielectric layer 140 is protected by the protective caps 141.

Figure 3K:
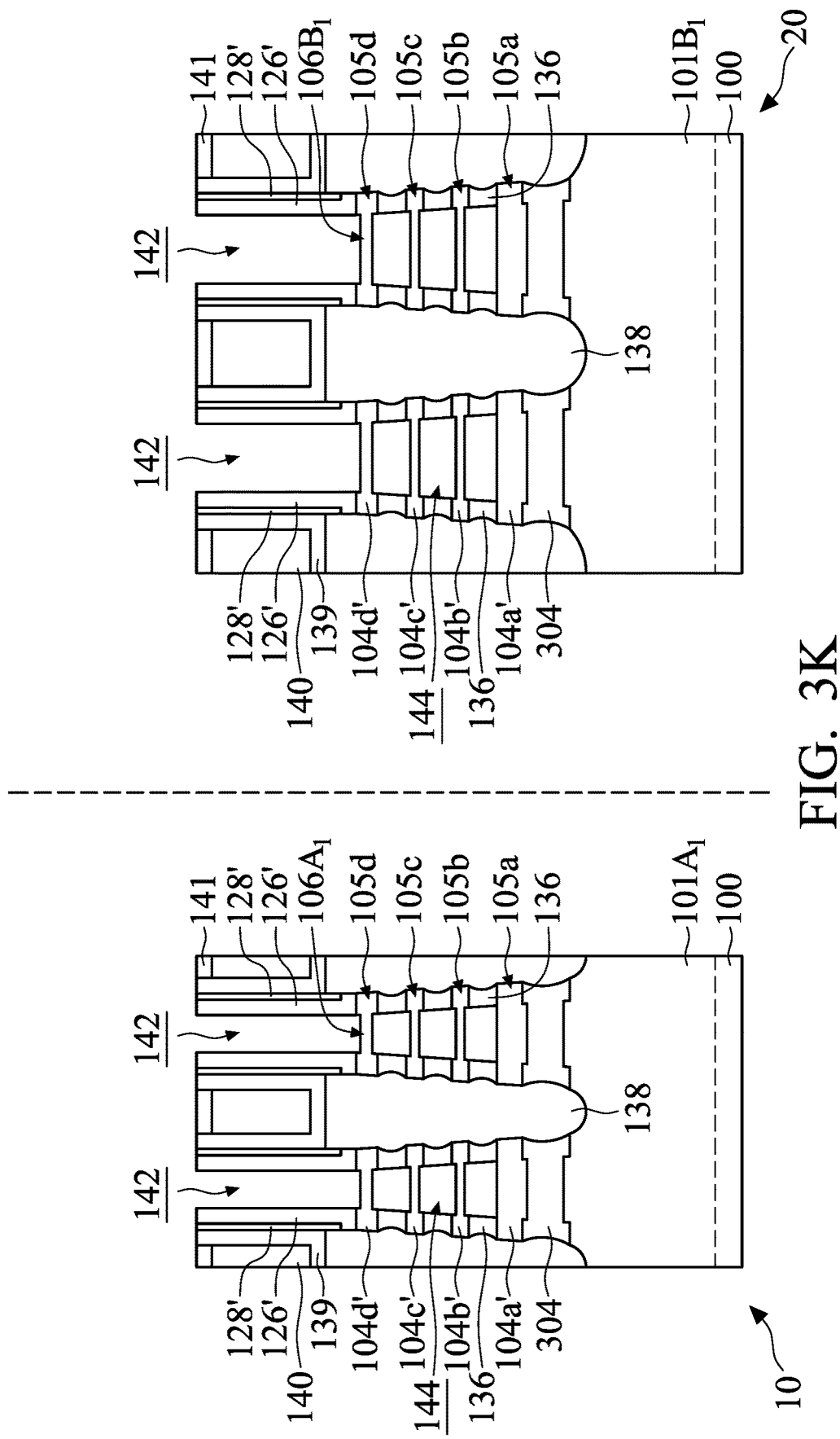

As shown in FIG. 3K, the dummy gate dielectric layer 116 and the semiconductor layers 102b-102d (that function as sacrificial layers) are removed, in accordance with some embodiments. In some embodiments, an etching process is used to remove the semiconductor layers 102b-102d. As a result, recesses 144 are formed, as shown in FIG. 3K.

Due to high etching selectivity, the semiconductor layers 104a-104d are slightly (or substantially not) etched. The remaining portions of the semiconductor layers 104b-104d form multiple semiconductor nanostructures 104b'-104d' of the fin structures $106A_1$ and $106B_1$, as shown in FIG. 3K. The semiconductor nanostructures 104b'-104d' are constructed by or made up of the remaining portions of the semiconductor layers 104b-104d. The semiconductor nanostructures 104b'-104d' suspended over the semiconductor fin $101A_1$ or $101B_1$ may function as channel structures of transistors. In some embodiments, each of the semiconductor nanostructures 104b'-104d' formed over the second region 20 is longer than each of the semiconductor nanostructures 104b'-104d' formed over the first region 10.

In some embodiments, the etchant used for removing the semiconductor layers 102b-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102b-102d. As shown in FIG. 3K, each of the semiconductor nanostructures 104b'-104d' is thinner than the edge portions 105b-105d since the edge portions 105b-105d are surrounded by other elements and thus are prevented from being reached and etched by the etchant, in accordance with some embodiments.

In some embodiments, due to the protection of the semiconductor layer 102b, the etchant used for removing the semiconductor layers 102b-102d slightly (or substantially not) etches the semiconductor layer 104a. As a result, the semiconductor layer 104a that remains form base structures 104a'. In some embodiments, the base structures 104a' also function as channel structures. In some other embodiments, the base structures 104a' do not function as channel structures. The base structures 104a' and the insulating structures 304 may also be used to increase physical distance between subsequently formed metal gate stacks and backside conductive contacts (if formed). Short circuiting between the metal gate stacks and the backside conductive contacts may be prevented.

After the removal of the semiconductor layers 102b-102d (that function as sacrificial layers), the recesses 144 are formed. The recesses 144 connect to the trench 142 and surround each of the semiconductor nanostructures 104b'-104d'. As shown in FIG. 3K, even if the recesses 144 between the semiconductor nanostructures 104b'-104d' are formed, the semiconductor nanostructures 104b'-104d' remain being held by the epitaxial structures 138. Therefore, after the removal of the semiconductor layers 102b-102d (that function as sacrificial layers), the released semiconductor nanostructures 104b'-104d' are prevented from falling down.

During the removal of the semiconductor layers 102b-102d (that function as sacrificial layers), the inner spacers 136 protect the epitaxial structures 138 from being etched or damaged. The quality and reliability of the semiconductor device structure are improved. During the removal of the semiconductor layers 102b-102d, the dielectric layer 140 is protected by the protective caps 141, which maintains the dielectric layer 140 with a suitable thickness.

Figure 3L:
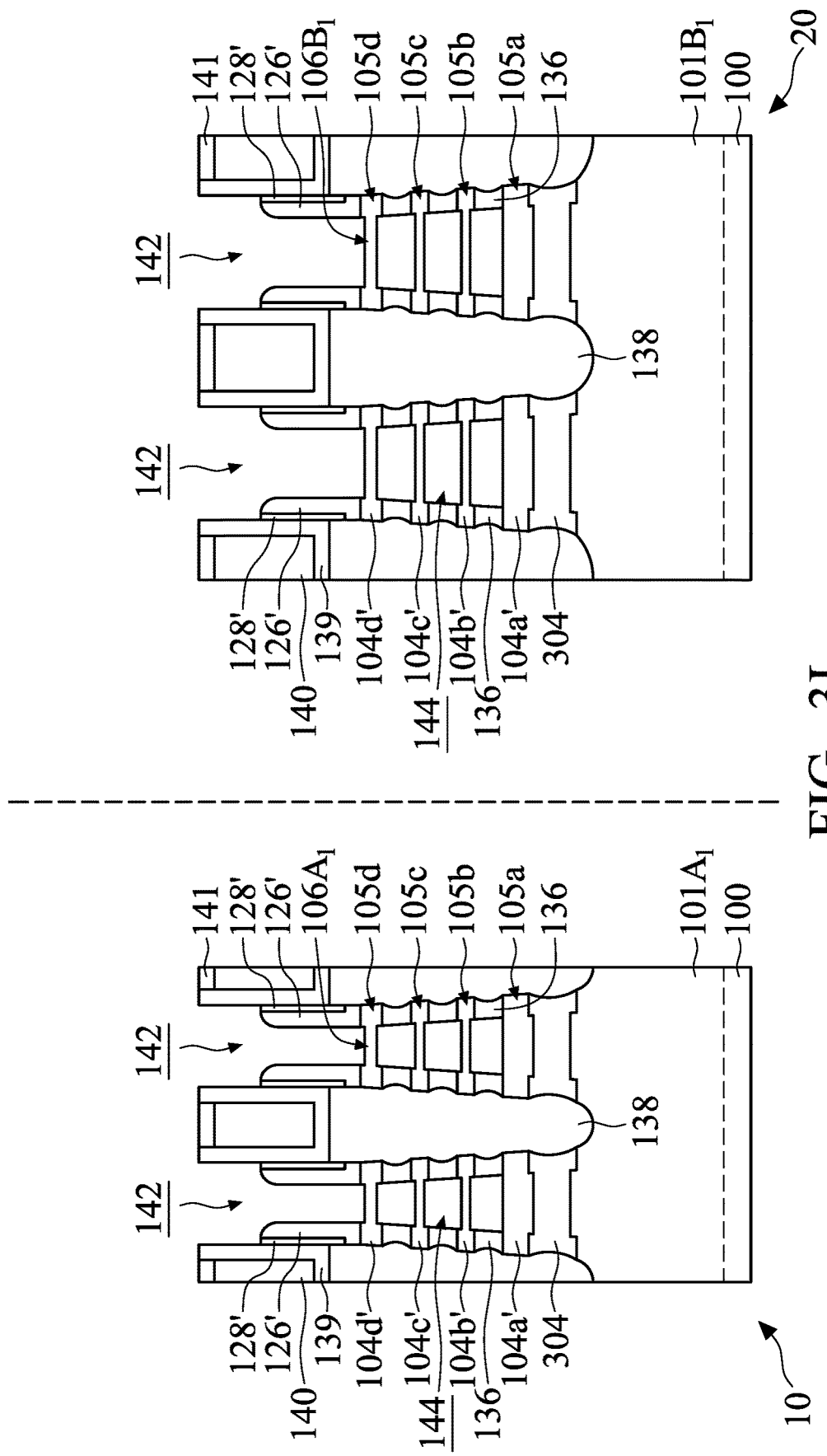

As shown in FIG. 3L, the gate spacers 126' and 128' are partially removed, in accordance with some embodiments. Upper portions of the gate spacers 126' and 128' may be removed. As a result, upper portions of the trenches 142 become wider or larger, which facilitates subsequent processes such as a subsequent filling process for forming metal gate stacks and a subsequent etching back process of the metal gate stacks. One or more etching processes may be used to partially remove the gate spacers 126' and 128'.

Figure 3M:
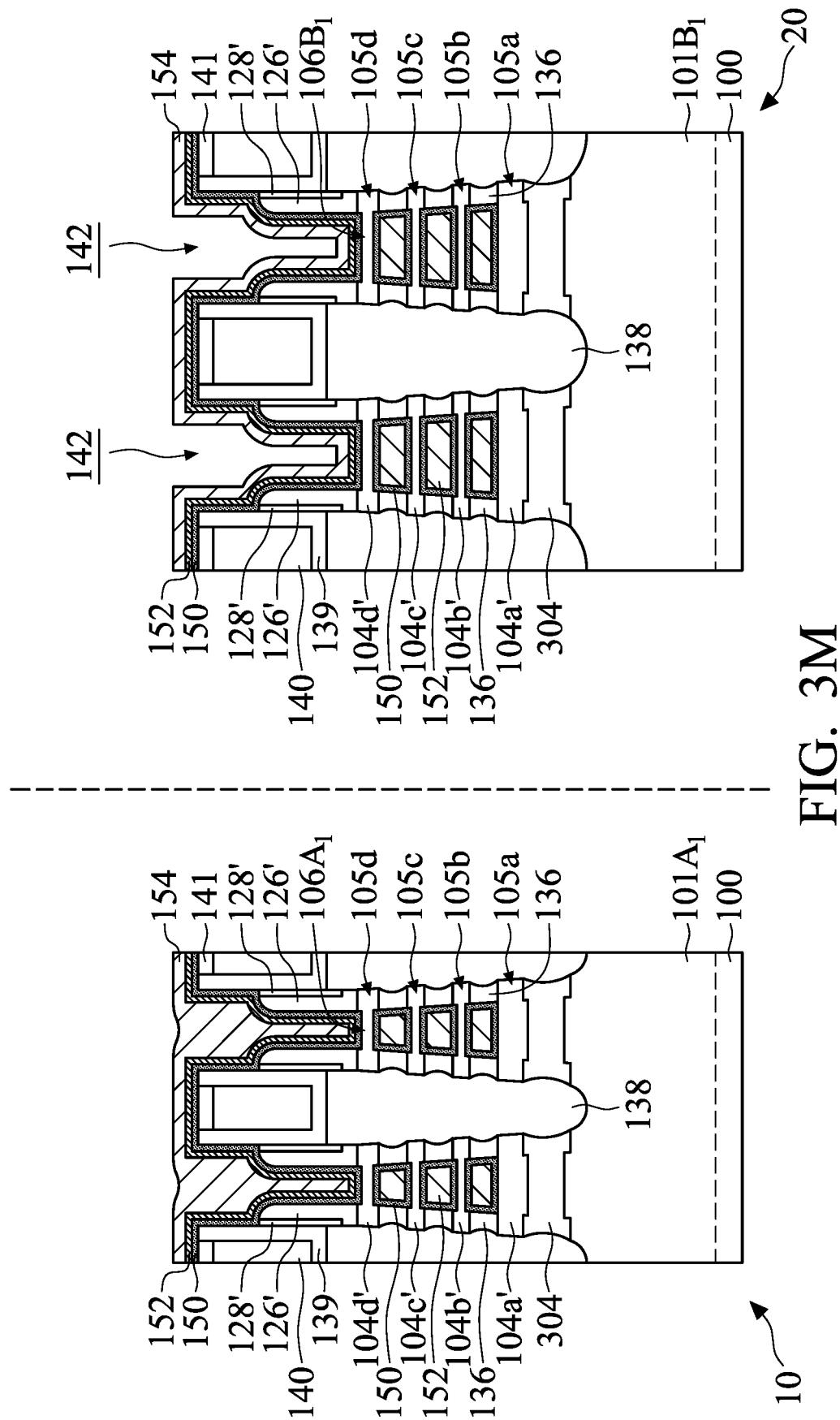

As shown in FIG. 3M, multiple metal gate stack layers are deposited over the structure shown in FIG. 3L, in accordance with some embodiments. In some embodiments, the metal gate stack layers in the trenches 142 formed over the first region 10 merge together and completely fill the respective trenches 142. In some embodiments, the metal gate stack layers partially fill the trenches 142 formed over the second region 20 since the trenches 142 over the second region 20 are wider. In some embodiments, the metal gate stack layers extend into the recesses 144 to wrap around each of the semiconductor nanostructures 104b'-104d', as shown in FIG. 3M. In some embodiments, the metal gate stack layers over the first region 10 and the second region 20 are simultaneously formed using the same deposition processes. First portions of the metal gate stack layers are formed in the trenches 142 over the first region 10, and second portions of the metal gate stack layers are formed in the trenches 142 over the second region 20.

The metal gate stack layers may include a gate dielectric layer 150, a work function layer 152, and a conductive layer 154. The conductive layer 154 may function as a conductive filling layer that completely fills the remaining space of the trenches 142 over the first region 10. In some embodiments, since the trenches 142 over the second region 20 (i.e., a long channel region) are wider, the conductive layer 154 cannot completely fills the trenches 142 over the second region 20.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104b'-104d' and the base structures 104a'. The interfacial layers are very thin and are made of, for example, silicon oxide or germanium oxide. In some embodiments, the interfacial layers are formed by applying an oxidizing agent on the surfaces of the semiconductor nanostructures 104b'-104d' and the base structures 104a'. For example, a hydrogen peroxide-containing liquid may be applied or provided on the surfaces of the semiconductor nanostructures 104b'-104d' and the base structures 104a', so as to form the interfacial layers.

The work function layer 152 may be used to provide the desired work function for transistors to enhance device performance including improved threshold voltage. In some embodiments, the work function layer 152 is used for forming a PMOS device. The work function layer 152 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer 152 is used for forming an NMOS device. The work function layer 152 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function layer is an aluminum-containing layer. The aluminum-containing layer may be made of or include TiAlC, TiAlO, TiAlN, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive layer 154 is made of or includes a metal material. The metal material may include tungsten, ruthenium, aluminum, copper, cobalt, titanium, one or more other suitable materials, or a combination thereof. The conductive layer 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer 154. The blocking layer may be used to prevent the subsequently formed conductive layer 154 from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

In some embodiments, the conductive layer 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling extends into the recesses 144 with larger space, such as the lower recesses 144 over the second region 20.

Figure 3N:
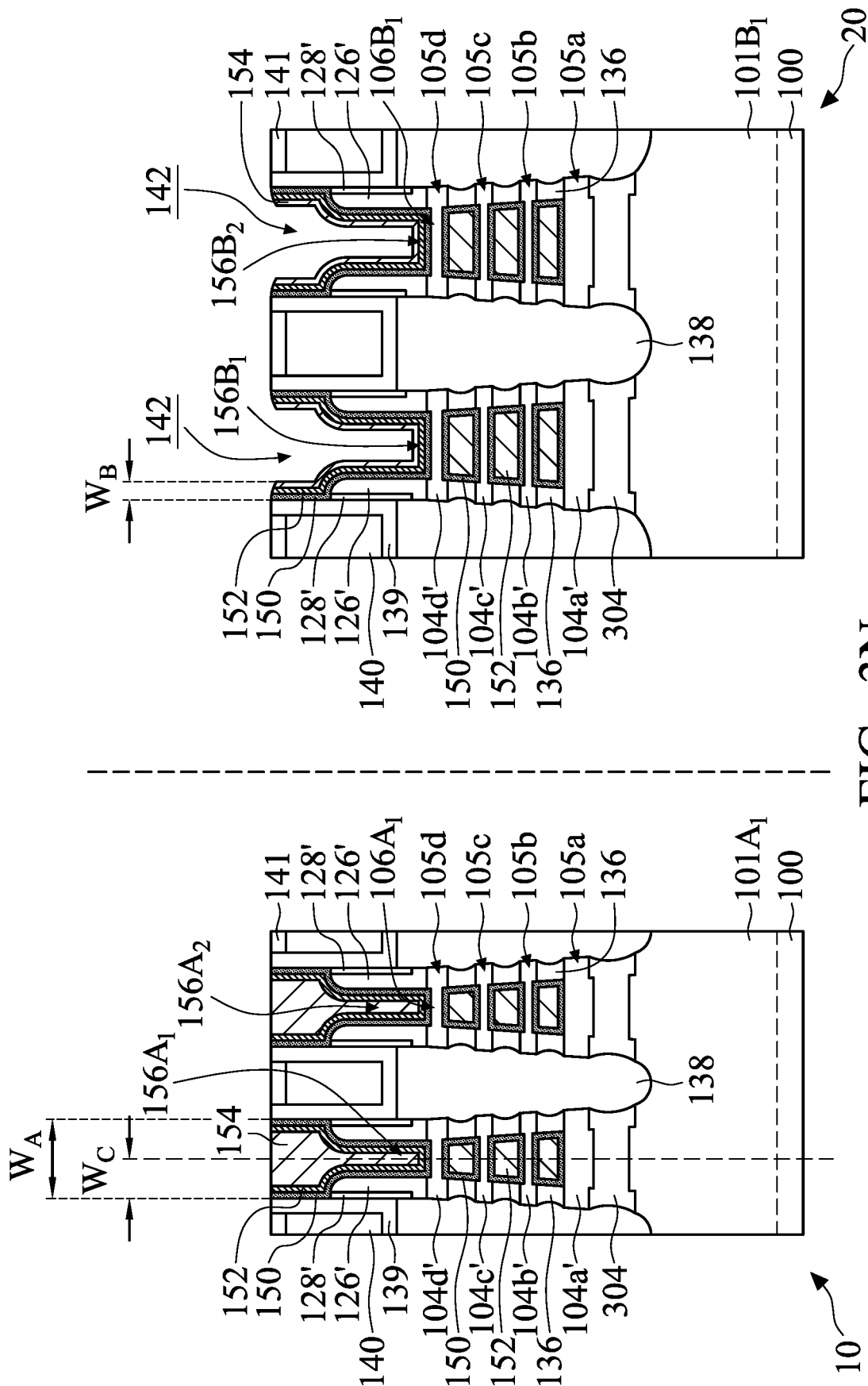

As shown in FIG. 3N, one or more etching processes are used to partially remove the metal gate stack layers, in accordance with some embodiments. In some embodiments, the metal gate stack layers outside of the trenches 142 are thus removed. In some embodiments, the portions of the metal gate stack layers in the trenches 142 over the second region 20 are trimmed. As a result, the remaining portions of the metal gate stack layers form metal gate stacks $156A_1$, $156A_2$, $156B_1$, and $156B_2$, as shown in FIG. 3N.

In some embodiments, the conductive layer 154 in the trenches 142 over the second region 20 is partially removed from the surface of the conductive layer 154 exposed by the trenches 142 and thus becomes thinner, as shown in FIG. 3N. Due to the partial removal of the metal gate stack layers, larger space is created in the trenches 142 over the second region 20, which facilitates a subsequent formation of protective structures in the respective trenches 142.

As shown in FIG. 3N, a top portion of the metal gate stack layers in the trench 142 over the first region 10 has a first width $W_A$. A top portion of the metal gate stack layers in the trench 142 over the second region 20 has a second width $W_B$. In some embodiments, half (i.e., the width $W_C$) of the first width $W_A$ is greater than the second width $W_B$. Half of the first width $W_A$ (i.e., the width $W_C$) may be in a range from about 5 nm to about 15 nm. The second width $W_B$ may be in a range from about 3 nm to about 12 nm.

Afterwards, a protective layer is deposited over the dielectric layer 140 and the metal gate stacks $156A_1$, $156A_2$, $156B_1$, and $156B_2$, in accordance with some embodiments. The protective layer overfills the trenches 142 over the second region 20. The protective layer may be made of or include SiN, SiCN, SiOC, SiOCN, SiC, SiON, SiO, AlO, AlN, AlON, ZrO, ZrN, ZrAlO, HfO, one or more other suitable materials, or a combination thereof. The protective layer may be deposited using a CVD process, an ALD process, an FCVD process, one or more other applicable processes, or a combination thereof.

Figure 3O:
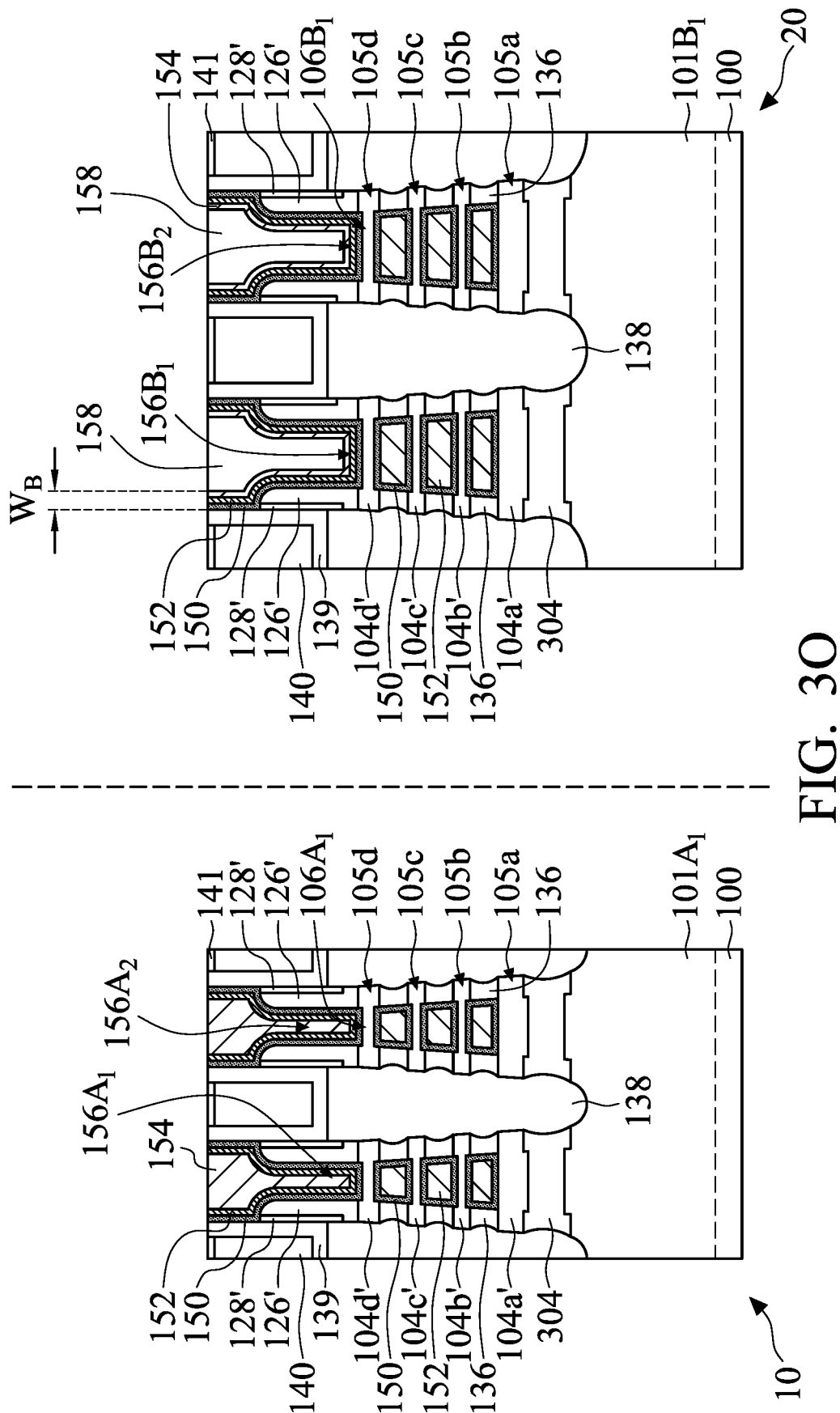

Afterwards, a planarization process is performed to remove the portions of the protective layer outside of the trenches 142. As a result, the remaining portions of the protective layer form protective structures 158 over the metal gate stacks $156B_1$ and $156B_2$, as shown in FIG. 3O in accordance with some embodiments. The planarization process may include a CMP process, an etching process, a grinding process, a dry polishing process, one or more other applicable processes, or a combination thereof. Because the conductive layer 154 of the metal gate stacks $156B_1$ and $156B_2$ is partially removed to become thinner, more available space is provided for the formation of the protective structures 158. Each of the protective structures 158 may thus have a sufficient size and strength to sustain the subsequent processes including a subsequent metal gate etching back process.

Figure 3P:
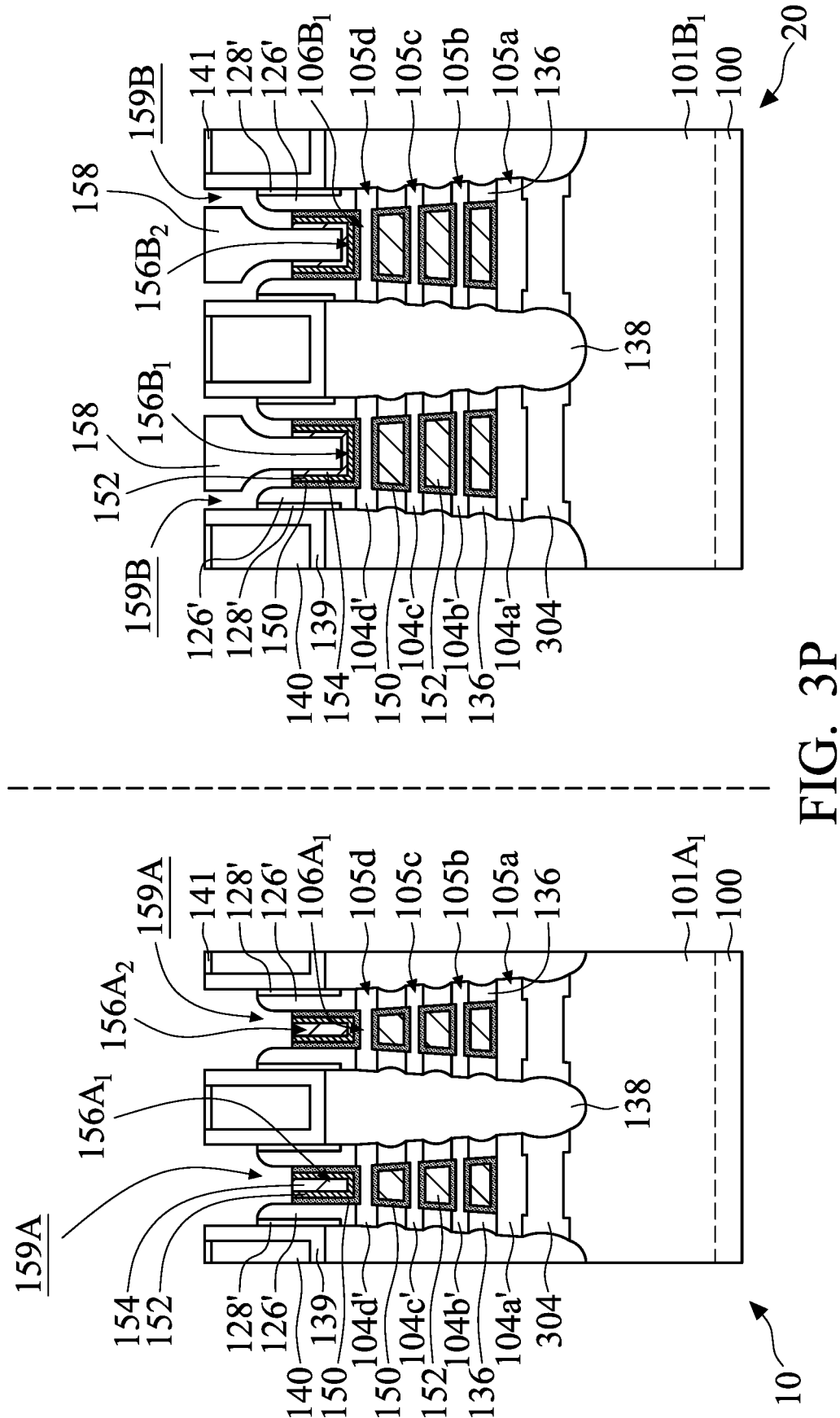

As shown in FIG. 3P, the metal gate stacks $156A_1$, $156A_2$, $156B_1$, and $156B_2$ are partially removed to form recesses 159A and 159B, in accordance with some embodiments. One or more etching processes may be used to etch back the metal gate stacks $156A_1$, $156A_2$, $156B_1$, and $156B_2$. In some embodiments, after the partial removal of the metal gate stacks $156A_1$, $156A_2$, $156B_1$, and $156B_2$, each of the metal gate stacks $156A_1$, $156A_2$, $156B_1$, and $156B_2$ is lower than the tops of the gate spacers 126' and 128', as shown in FIG. 3P. The tops of the gate spacers 126' and 128' are higher than the tops of the metal gate stacks $156A_1$, $156A_2$, $156B_1$, and $156B_2$. As mentioned above, each of the protective structures 158 may have a sufficient size. The adhesion between the protective structures 158 and the neighboring elements is enhanced. The protective structures 158 are prevented from the peeling issue and/or the collapse issue even if the metal gate stacks $156B_1$ and $156B_2$ are etched back.

Figure 3Q:
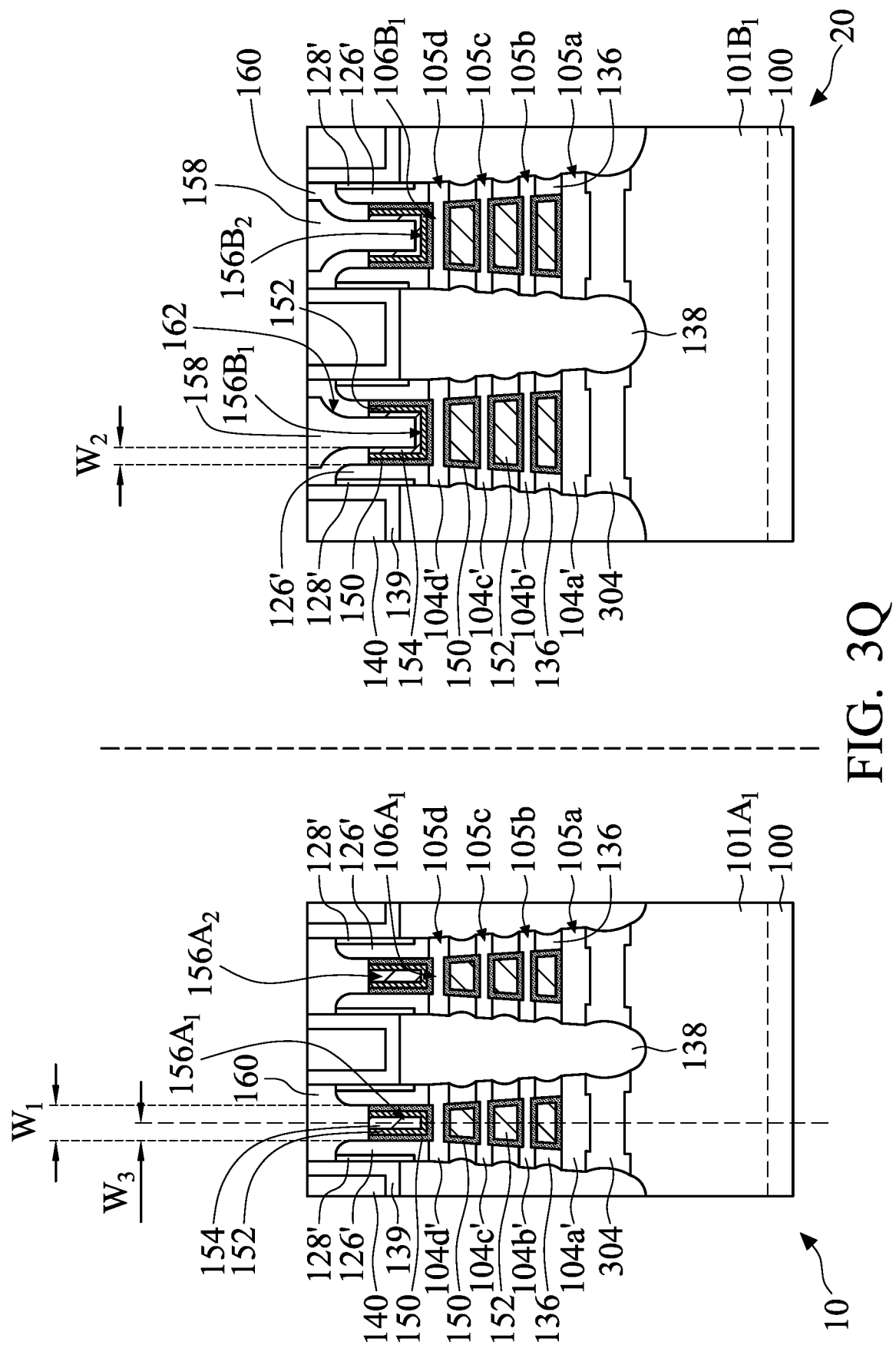

As shown in FIG. 3Q, protective structures 160A are formed over the metal gate stacks $156A_1$ and $156A_2$, and protective structures 160B are formed over the metal gate stacks $156B_1$ and $156B_2$, in accordance with some embodiments. The protective structures 158, 160A, and 160B may be used to protect the metal gate stacks thereunder. The protected metal gate stacks may thus be prevented from being damaged during the subsequent processes such as a subsequent contact formation process.

Each of the protective structures 160B extends along the sidewall of the nearby protective structure 158. In some embodiments, each of the protective structures 160B is in direct contact with the nearby protective structure 158. In some embodiments, each of the protective structures 160B is in direct contact with the nearby protective structure 158, the nearby gate spacers 126' and 128', and the nearby metal gate stack $156B_1$ or $156B_2$. In some embodiments, the bottommost surface of the protective structure 158 is lower than the bottommost surface of the protective structure 160B or the topmost surface of the metal gate stack $156B_1$ or $156B_2$.

In some embodiments, the protective structures 160A and the protective structures 160B are made of the same material. In some embodiments, the protective structures 160A and the protective structures 160B are formed simultaneously. In some other embodiments, the protective structures 160A and the protective structures 160B are formed separately. In these cases, the protective structures 160A and the protective structures 160B may be made of different materials. For example, the protective structures 160B may be made of a dielectric material that has a better filling ability than that of the material used for forming the protective structures 160A. In some embodiments, the protective structures 160B (or 160A) and the protective structures 158 are made of the same material. In some other embodiments, the protective structures 160B (or 160A) and the protective structures 158 are made of different materials.

In some embodiments, a protective layer is deposited over the structure shown in FIG. 3O to overfill the recesses 159A and 159B, in accordance with some embodiments. The protective layer may be made of or include SiN, SiCN, SiOC, SiOCN, SiC, SiON, SiO, AlO, AN, AlON, ZrO, ZrN, ZrAlO, HfO, one or more other suitable materials, or a combination thereof. The protective layer may be deposited using a CVD process, an ALD process, an FCVD process, one or more other applicable processes, or a combination thereof.

Afterwards, a planarization process is performed to remove the portions of the protective layer outside of the recesses 159A and 159B. As a result, the remaining portions of the protective layer form the protective structures 160A and 160B, as shown in FIG. 3Q in accordance with some embodiments. The planarization process may include a CMP process, an etching process, a grinding process, a dry polishing process, one or more other applicable processes, or a combination thereof.

As shown in FIG. 3Q, the metal gate stack $156A_1$ has a width $W_1$. As shown in FIG. 3Q, the metal gate stack $156B_1$ has a protruding portion that extends away from the semiconductor nanostructures $104b'$-$104d'$ along the nearby gate spacer 126', and the portion of the metal gate stack $156B_1$ has a width $W_2$. In some embodiments, half (i.e., the width $W_3$) of the width $W_1$ is greater than the width $W_2$.

As shown in FIG. 3Q, the conductive layer 154 of the metal gate stack 156A₁ or 156A₂ is thicker than the conductive layer 154 of the metal gate stack 156B₁ or 156B₂. However, embodiments of the disclosure are not limited thereto. Many variations and/or modifications can be made to embodiments of the disclosure. For example, in some embodiments, the metal gate stacks over the first region 10 include the conductive layer 154, and the metal gate stacks over the second region 10 do not include the conductive layer 154.

Figure 4A:
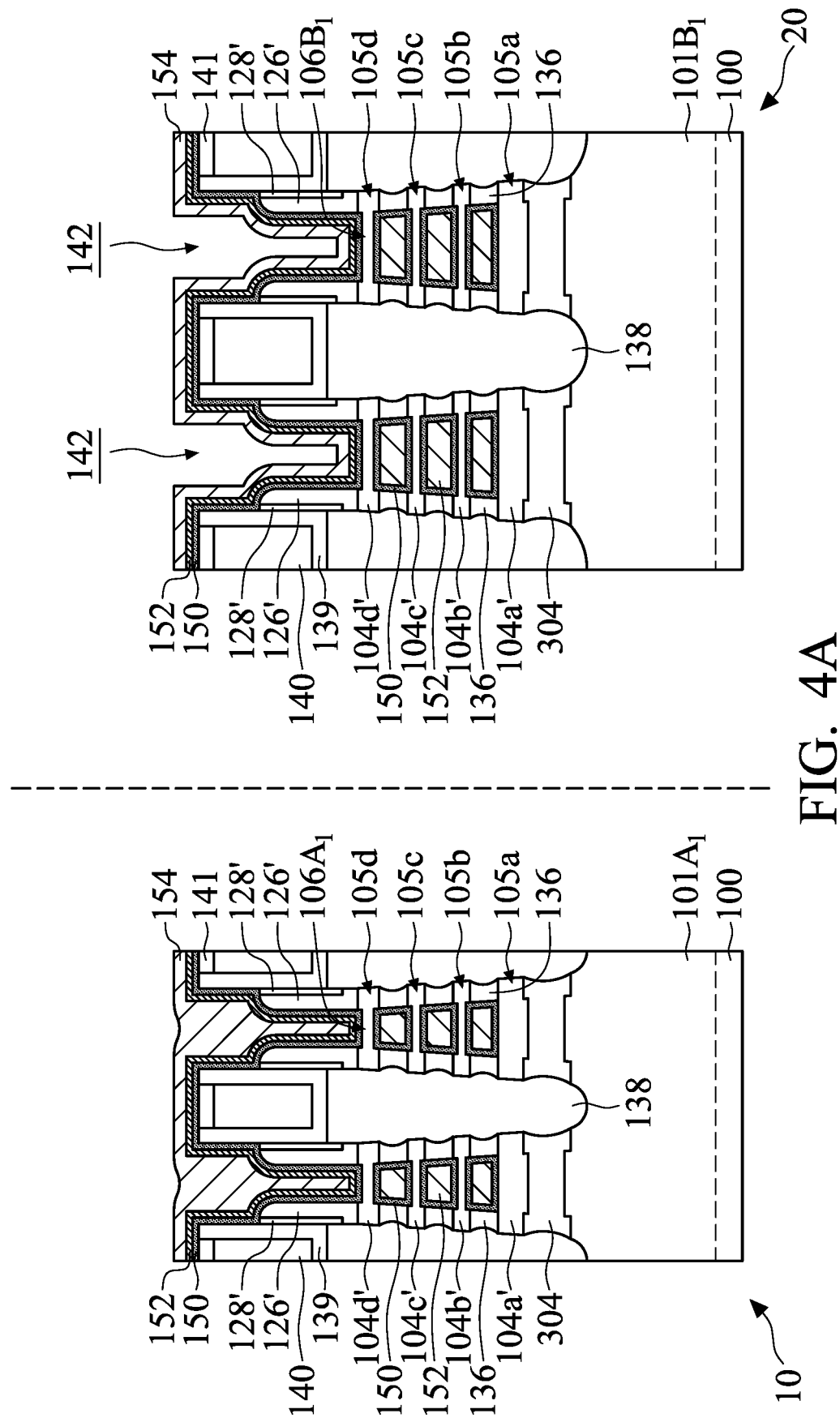
FIGS. 4A-4C are cross-sectional views of various stages of a process for forming a semiconductor device structure, in accordance with some embodiments.
Figure 4B:
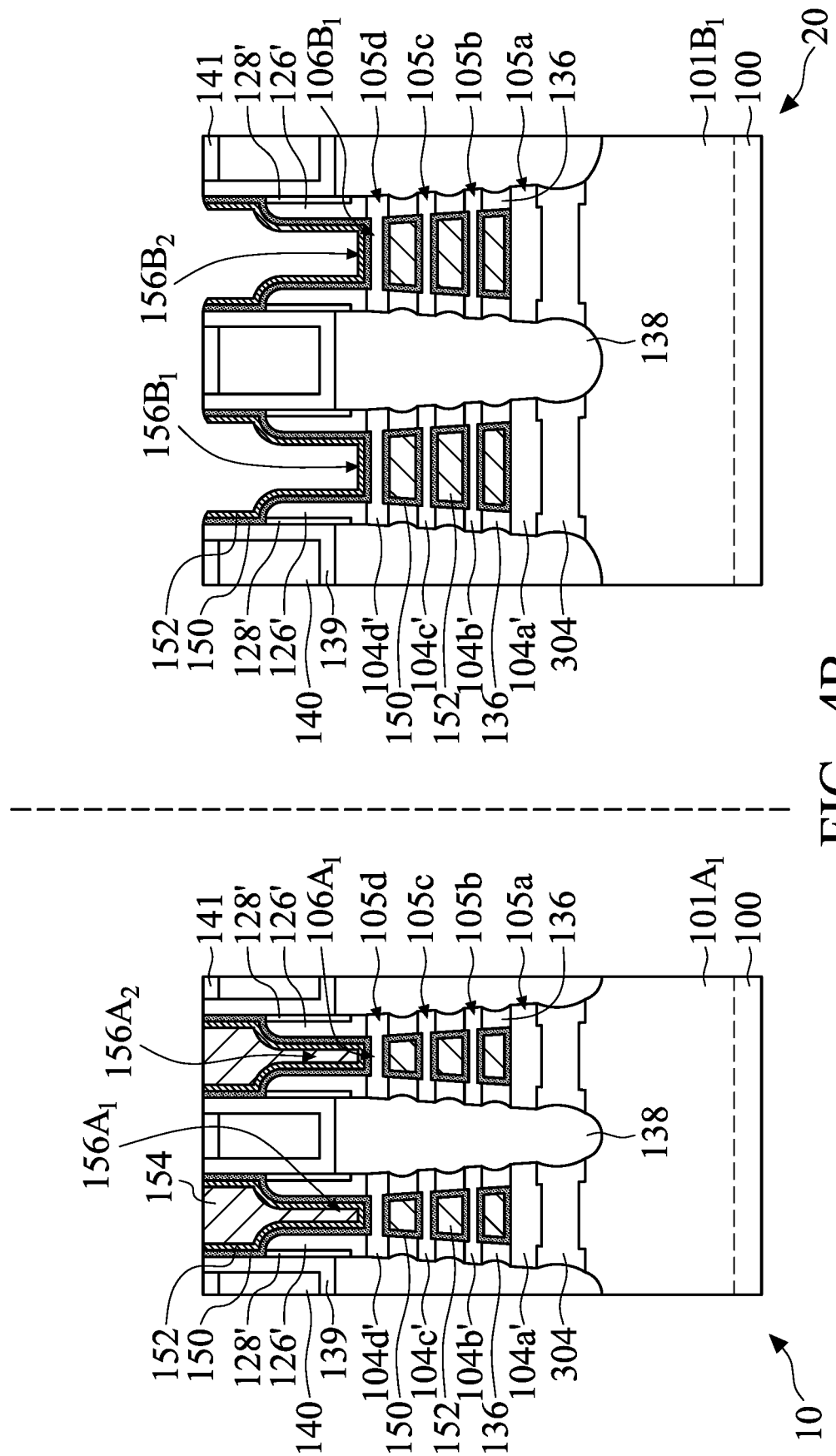
Figure 4C:
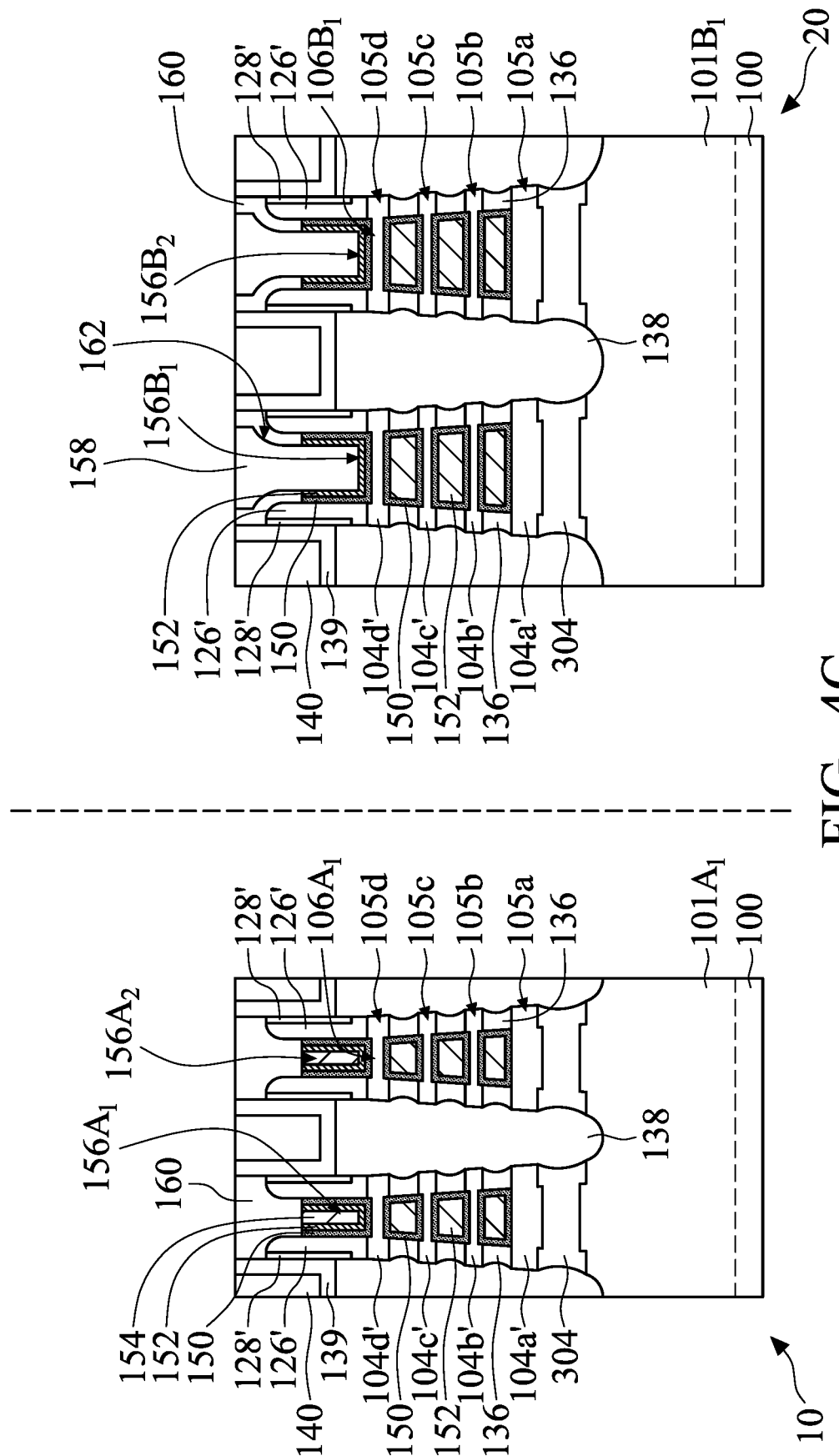

FIGS. 4A-4C are cross-sectional views of various stages of a process for forming a semiconductor device structure, in accordance with some embodiments. As shown in FIG. 4A, a structure the same as or similar to the structure shown in FIG. 3M is formed. Afterwards, similar to the embodiments illustrated in FIG. 3N, the metal gate stack layers are partially removed. In some embodiments, the conductive layer 154 originally formed over the second region 20 is completely removed, as shown in FIG. 4B. As a result, the work function layer 152 (that is originally covered by the conductive layer 154) is exposed.

Afterwards, the processes similar to those illustrated in FIGS. 3O-3Q are performed, in accordance with some embodiments. As a result, the structure shown in FIG. 4C is formed. In some embodiments, the protective structures 158 are in direct contact with the nearby work function layer 152.

In some embodiments, there are four channel structures (such as the semiconductor nanostructures 104a'-104d') formed. However, embodiments of the disclosure are not limited thereto. Many variations and/or modifications can be made to embodiments of the disclosure. In some embodiments, the total number of the semiconductor nanostructures is greater than four. In some other embodiments, the total number of the semiconductor nanostructures is smaller than four. The total number of the semiconductor nanostructures (or channel structures) of each semiconductor device structure may be fine-tuned to meet requirements. For example, the total number of the semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with a first metal gate stack and a second metal gate stack over a short channel device and a long channel device, respectively. The second metal gate stack is wider than the first metal gate stack. Before forming a protective structure over the second metal gate stack, the second metal gate stack is trimmed to be thinner to provide larger space for containing the protective structure. The protective structures may thus have a sufficient size to provide larger contact area with the neighboring elements. The adhesion between the protective structures and the neighboring elements is enhanced. The protective structures may be prevented from the peeling issue and/or the collapse issue even if the second metal gate stack is etched back during a subsequent process. The performance and reliability of the semiconductor device structure are thus greatly improved.

In accordance with some embodiments, a semiconductor device structure is provided. The semiconductor device structure includes a first channel structure and a second channel structure over a substrate. The second channel structure is longer than the first channel structure. The semiconductor device structure also includes a first gate stack over the first channel structure, and the first gate stack has a first width. The semiconductor device structure further includes a first gate spacer extending along a sidewall of the first gate stack. In addition, the semiconductor device structure includes a second gate stack over the second channel structure and a second gate spacer extending along a sidewall of the second gate stack. The second gate stack has a portion extending along the second gate spacer, and the portion of the second gate stack has a second width. Half of the first width is greater than the second width.

In accordance with some embodiments, a semiconductor device structure is provided. The semiconductor device structure includes a stack of first channel structures and a stack of second channel structures over a substrate. The semiconductor device structure also includes a first metal gate stack wrapped around the first channel structures, and the first metal gate stack has a first width. The semiconductor device structure further includes a second metal gate stack wrapped around the second channel structures. The second gate stack has a protruding portion extending away from the second channel structures. The protruding portion of the second metal gate stack has a second width, and half of the first width is greater than the second width.

In accordance with some embodiments, a method for forming a semiconductor device structure is provided. The method includes respectively forming a first dummy gate stack and a second dummy gate stack over a first channel structure and a second channel structure. The second dummy gate stack is wider than the first dummy gate stack. The method also includes forming a dielectric layer to surround the first dummy gate stack and the second dummy gate stack. The method further includes removing the first dummy gate stack and the second dummy gate stack to form a first trench and a second trench. In addition, the method includes forming metal gate stack layers with a first portion in the first trench and a second portion in the second trench. The method includes trimming the second portion of the metal gate stack layers in the second trench. The method also includes forming a protective structure over the second portion after the second portion is thinned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first channel structure and a second channel structure over a substrate, wherein the second channel structure is longer than the first channel structure;
   a first gate stack over the first channel structure, wherein the first gate stack has a first width;
   a first gate spacer extending along a sidewall of the first gate stack;
   a second gate stack over the second channel structure, wherein the first gate stack has a first work function layer and a first conductive layer, the second gate stack has a second work function layer and a second conductive layer, the first work function layer and the second work function layer are made of a same material, the first conductive layer and the second conductive layer are made of a same material, and the first conductive layer is thicker than the second conductive layer;
a second gate spacer extending along a sidewall of the second gate stack, wherein the second gate stack has a portion extending along the second gate spacer, the portion of the second gate stack has a second width, and half of the first width is greater than the second width;
a first protective structure over the first gate stack, wherein a top of the first gate spacer is closer to the substrate than a top surface of the first protective structure; and
a second protective structure over the second gate stack, wherein a top of the second gate spacer is closer to the substrate than a top surface of the second protective structure.

2. The semiconductor device structure as claimed in claim 1, wherein the top of the first gate spacer is higher than a top of the first gate stack, and the top of the second gate spacer is higher than a top of the second gate stack.

3. The semiconductor device structure as claimed in claim 1, wherein a bottommost surface of the second protective structure is lower than a topmost surface of the second gate stack.

4. The semiconductor device structure as claimed in claim 1, wherein the first protective structure and the second protective structure are made of a same material.

5. The semiconductor device structure as claimed in claim 1, further comprising a third protective structure over the second gate stack, wherein the third protective structure extends along a sidewall of the second protective structure.

6. The semiconductor device structure as claimed in claim 5, wherein the first protective structure and the third protective structure are made of a same material.

7. The semiconductor device structure as claimed in claim 5, wherein the second protective structure and the third protective structure are made of different materials.

8. The semiconductor device structure as claimed in claim 5, wherein the third protective structure is in direct contact with the second gate spacer, the second gate stack, and the second protective structure.

9. The semiconductor device structure as claimed in claim 5, wherein a bottommost surface of the third protective structure is closer to the second channel structure than a bottommost surface of the second protective structure.

10. The semiconductor device structure as claimed in claim 5, wherein topmost surfaces of the second protective structure and the third protective structure as substantially level with each other.

11. The semiconductor device structure as claimed in claim 1, wherein the second protective element is in direct contact with the second gate stack.

12. A semiconductor device structure, comprising:
a stack of first channel structures and a stack of second channel structures over a substrate;
a first metal gate stack wrapped around the first channel structures, wherein the first metal gate stack has a first width;
a second metal gate stack wrapped around the second channel structures, wherein the second metal gate stack has a protruding portion extending away from the second channel structures, the protruding portion of the second metal gate stack has a second width, and half of the first width is greater than the second width;
a first protective structure over the first metal gate stack;
a second protective structure over the second metal gate stack; and
a third protective structure over the second metal gate stack, wherein the third protective structure extends along a sidewall of the second protective structure.

13. The semiconductor device structure as claimed in claim 12, wherein the first metal gate stack has a first work function layer and a first conductive layer, the second metal gate stack has a second work function layer and a second conductive layer, the first work function layer and the second work function layer are made of a same material, the first conductive layer and the second conductive layer are made of a same material, and the first conductive layer is thicker than the second conductive layer.

14. The semiconductor device structure as claimed in claim 12, wherein the first metal gate stack has a first work function layer and a first conductive layer, the second metal gate stack has a second work function layer, and the first work function layer and the second work function layer are made of a same material.

15. The semiconductor device structure as claimed in claim 14, wherein the second work function layer is in direct contact with the second protective structure.

16. The semiconductor device structure as claimed in claim 12, wherein a bottommost surface of the second protective structure is lower than a topmost surface of the second metal gate stack.

17. A method for forming a semiconductor device structure, comprising:
respectively forming a first dummy gate stack and a second dummy gate stack over a first channel structure and a second channel structure, wherein the second dummy gate stack is wider than the first dummy gate stack;
forming a dielectric layer to surround the first dummy gate stack and the second dummy gate stack;
removing the first dummy gate stack and the second dummy gate stack to form a first trench and a second trench;
forming metal gate stack layers with a first portion in the first trench and a second portion in the second trench;
trimming the second portion of the metal gate stack layers in the second trench;
forming a protective structure over the second portion after the second portion is thinned;
etching back the first portion and the second portion of the metal gate stack layers after the protective structure is formed;
forming a second protective structure over the first portion; and
forming a third protective structure over the second portion, wherein the third protective structure extends along a sidewall of the protective structure.

18. The method for forming a semiconductor device structure as claimed in claim 17, wherein the second protective structure and the third protective structure are made of a same material.

19. The method for forming a semiconductor device structure as claimed in claim 17, further comprising:
forming a first gate spacer over a sidewall of the first dummy gate stack before the dielectric layer is formed; and
forming a second gate spacer over a sidewall of the second dummy gate stack before the dielectric layer is formed.

20. The method for forming a semiconductor device structure as claimed in claim 19, further comprising partially removing the first gate spacer and the second gate spacer after the first dummy gate stack and the second dummy gate stack are removed and before the metal gate stack layers are formed.

* * * * *